(12) United States Patent
Miyamura et al.

(10) Patent No.: US 9,849,449 B2
(45) Date of Patent: Dec. 26, 2017

(54) AMORPHOUS INORGANIC ANION EXCHANGER, RESIN COMPOSITION FOR ELECTRONIC COMPONENT SEALING, AND PROCESS FOR PRODUCING AMORPHOUS BISMUTH COMPOUND

(71) Applicant: TOAGOSEI CO., LTD., Tokyo (JP)

(72) Inventors: Kentarou Miyamura, Nagoya (JP); Tomohisa Iinuma, Nagoya (JP); Yasuharu Ono, Nagoya (JP)

(73) Assignee: TOAGOSEI CO., LTD., Tokyo (JP)

(*) Notice: Subject to any disclaimer, the term of this patent is extended or adjusted under 35 U.S.C. 154(b) by 229 days.

(21) Appl. No.: 14/410,256

(22) PCT Filed: Jun. 13, 2013

(86) PCT No.: PCT/JP2013/066305
§ 371 (c)(1),
(2) Date: Dec. 22, 2014

(87) PCT Pub. No.: WO2013/191075
PCT Pub. Date: Dec. 27, 2013

(65) Prior Publication Data
US 2015/0321189 A1    Nov. 12, 2015

(30) Foreign Application Priority Data

Jun. 21, 2012 (JP) .................. 2012-140108
Jun. 21, 2012 (JP) .................. 2012-140109

(51) Int. Cl.
*B01J 41/02* (2006.01)
*C01G 29/00* (2006.01)
(Continued)

(52) U.S. Cl.
CPC ............. *B01J 41/02* (2013.01); *B01J 39/09* (2017.01); *B01J 39/12* (2013.01); *B01J 39/14* (2013.01);
(Continued)

(58) Field of Classification Search
USPC ............................................ 521/25; 423/617
See application file for complete search history.

(56) References Cited

U.S. PATENT DOCUMENTS 4,873,073 A * 10/1989 Matsui .................. C01G 29/00
423/617

FOREIGN PATENT DOCUMENTS

JP    63-060112    *  3/1988
JP    63-060112 A  *  3/1988
(Continued)

OTHER PUBLICATIONS

Li, "Nanoscale Bismuth Oxide Hydroxide and Nanoscale Bismuth Trioxide Produced by Dry-Wet Method for Use in Stomach Medicine," Anhui Province Scientific and Technical Literature and innovative Services and Platforms, 2008, http://113.31.20,171:81/articles/article_detail.aspx?id=CG00224334, p. 1, see English translation.*

Tsuji et al., "Anion Intercalation and Anion Exchange in Bismuth Compounds," Dec. 31, 2003, MRS Proceedings, vol. 755, pp. DD6.10.1-DD6.10.6.*

(Continued)

*Primary Examiner* — Mark Kaucher
*Assistant Examiner* — Henry Hu
(74) *Attorney, Agent, or Firm* — Birch, Stewart, Kolasch & Birch, LLP

(57) ABSTRACT

The amorphous inorganic anion exchanger of the present invention is represented by Formula (1) and has an average primary particle size observed with an electron microscope of at least 1 nm but no greater than 500 nm and an $NO_3$ content of no greater than 1 wt % of the whole:

BiO(OH)    Formula (1).

17 Claims, 5 Drawing Sheets

(51) Int. Cl.
  *B32B 7/12* (2006.01)
  *B01J 41/10* (2006.01)
  *C08K 3/22* (2006.01)
  *C09J 11/04* (2006.01)
  *H01L 23/29* (2006.01)
  *B01J 41/14* (2006.01)
  *B01J 39/12* (2006.01)
  *B01J 39/14* (2006.01)
  *B01J 47/04* (2006.01)
  *B01J 39/09* (2017.01)

(52) U.S. Cl.
  CPC ............... *B01J 41/10* (2013.01); *B01J 41/14* (2013.01); *B01J 47/04* (2013.01); *B32B 7/12* (2013.01); *C01G 29/00* (2013.01); *C08K 3/22* (2013.01); *C09J 11/04* (2013.01); *H01L 23/293* (2013.01); *B32B 2264/102* (2013.01); *B32B 2457/00* (2013.01); *C01P 2002/02* (2013.01); *C01P 2002/72* (2013.01); *C01P 2004/61* (2013.01); *C01P 2006/12* (2013.01); *C01P 2006/80* (2013.01); *H01L 2924/0002* (2013.01); *Y10T 428/239* (2015.01); *Y10T 428/25* (2015.01); *Y10T 428/2982* (2015.01)

(56) References Cited

FOREIGN PATENT DOCUMENTS

| JP | 63-60112 A | | 3/1988 |
| JP | 01-246140 A | * | 10/1989 |
| JP | 1-246140 A | | 10/1989 |
| JP | 07-267643 | * | 10/1995 |
| JP | 07-267643 A | * | 10/1995 |
| JP | 7-267643 A | | 10/1995 |

OTHER PUBLICATIONS

International Search Report, issued in PCT/JP2013/066305, dated Sep. 17, 2013.
Chinese Office Action and Search Report, dated Jul. 7, 2016, for Chinese Application No. 201380032643.8.
Li, "Nanoscale Bismuth Oxide Hydroxide and Nanoscale Bismuth Trioxide Produced by Dry-Wet Method for Use in Stomach Medicine," Anhui Province Scientific and Technical Literature and Innovative Services and Platforms, 2008, http://113.31.20.171:81/articles/article_detail.aspx?id=CG00224334, p. 1.
Tiawanese Office Action, dated Aug. 18, 2016, for Taiwanese Application No. 102121848, together with a partial English translation thereof.

* cited by examiner

AMORPHOUS INORGANIC ANION EXCHANGER, RESIN COMPOSITION FOR ELECTRONIC COMPONENT SEALING, AND PROCESS FOR PRODUCING AMORPHOUS BISMUTH COMPOUND

TECHNICAL FIELD

The present invention relates to an amorphous inorganic anion exchanger, a resin composition for electronic component sealing, resin for electronic component sealing, electronic component, varnish, adhesive, paste, and article comprising the amorphous inorganic anion exchanger, and a process for producing an amorphous bismuth compound.

BACKGROUND ART

Many electronic components such as LSIs, ICs, hybrid ICs, transistors, diodes, thyristors, and hybrid components thereof are usually sealed using a resin composition for electronic component sealing in order to protect an electronic circuit or package from the influence of contamination, moisture, etc. from the external environment. Such an electronic component sealing material is required to suppress failure due to ionic impurities in starting materials or moisture entering from the outside as well as to have various properties such as flame retardancy, high adhesion, anti-cracking properties, and electrical properties such as high volume resistivity.

The resin composition for electronic component sealing often employs an epoxy resin that has good adhesion to metal wiring or a semiconductor chip and high heat resistance, and the resin composition for sealing often comprises, in addition to an epoxy compound as a main component, an epoxy compound curing agent, a curing promoter, an inorganic filler, a flame retardant, a pigment, a silane coupling agent, etc.

It is conventionally known that, although an epoxy resin is an excellent resin for sealing, it contains trace amounts of ionic impurities, and it is also known that there is a possibility that ionic impurities will corrode metal wiring of aluminum, etc. used in a wiring circuit for a semiconductor chip. On the other hand, accompanying recent increases in integration and increases in the speed of semiconductor circuits, there has been a great increase in the temperature of semiconductor chips due to Joule heating generated when the circuit is operating; sealing materials comprise large amounts of flame retardants such as antimony oxide, brominated epoxy resins, inorganic hydroxides, etc., and because of these flame retardant components corrosion of metal wiring such as aluminum wiring occurs more readily. This corrosion is accelerated mainly by infiltration of moisture into the epoxy resin used as a sealing material.

In order to prevent this corrosion, an epoxy resin composition for semiconductor sealing formed by mixing an epoxy resin with a bismuth compound, which is an inorganic anion exchanger, is known. Patent Document 1 discloses a bismuth compound represented by Formula (3) below as an inorganic anion exchanger and discloses that it can be used for adsorptive fixation of impurity ions in solid materials related to the electrical/electronic field. With regard to nitrate ion $(NO_3)_{6-x}$ in the composition it defines the necessity for $3.5 \leq x \leq 5.5$; when x is greater than 5.5 due to there being few $NO_3$ groups in the compound the ion exchange capacity or exchange rate at around neutral becomes small, and as a result of the structure becoming close to that of normal hydrated bismuth oxide, the water resistance easily deteriorates, which is a defect of normal hydrated bismuth oxide.

$$Bi_6O_6(OH)_x(NO_3)_{6-x} \cdot nH_2O \qquad (3)$$

In Formula (3), when x is greater than 5.5, if n is 0 or 1 this corresponds to a case in which $(NO_3)$ contained in an inorganic anion exchanger is less than 2%. That is, it is known that in an inorganic anion exchanger comprising a bismuth compound, one containing $(NO_3)$ at greater than 2% has a large ion exchange capacity or exchange rate at around neutral, and the water resistance is excellent, whereas one containing less $(NO_3)$ tends to have poor water resistance.

Furthermore, as a conventional process for producing a bismuth compound, Patent Document 1 discloses a method in which an equivalent amount of alkali is added over about 2 hours to bismuth nitrate having excess nitrate and a method in which in order to make the value of the subscript x in Formula (3) larger by 1, about 1 mole of alkali is further added, and it is also disclosed that a preferred reaction temperature is in the range of 20° C. to 50° C.

Moreover, Patent Document 2 discloses a bismuth compound represented by Formula (4) below and discloses that it is excellent as an inorganic ion exchanger for removing chloride ions, and since with regard to nitrate ion $(NO_3)_{4-2x}$ in the composition it defines the necessity for $-0.18 \leq x \leq 0.29$, when $NO_3$ is converted to a proportion by mass it corresponds to 8.4% to 10.5%, and a high nitrate ion content is essential.

$$Bi_{10}O_{13+x}(NO_3)_{4-2x} \qquad (4)$$

Furthermore, Patent Document 2 discloses that by thermal decomposition of a bismuth compound with a ratio of $(NO_3)$ to Bi of preferably greater than 4:10 as a starting material, a crystalline bismuth compound represented by Formula (4) above can be obtained, and it states that when thermal decomposition is carried out up to 630° C. crystalline $Bi_2O_3$ is obtained.

As a production process therefor, it is known that such a bismuth compound can be obtained by hydrolyzing bismuth nitrate by reacting with an alkali solution, but it is also known that this method only gives columnar crystals having an average particle size of 5 to 10 μm (see Patent Document 3).

Patent Document 3 discloses a method in which an equimolar or greater amount of a monocarboxylic acid is added to an aqueous solution containing trivalent bismuth ion and having a pH of no greater than 1.0 to thus form a bismuth-monocarboxylic acid complex, and an alkali is subsequently added thereto to thus precipitate the complex, followed by calcination, thereby giving crystalline bismuth oxide (III) ($Bi_2O_3$) microparticles. It is disclosed here that when a monocarboxylic acid is added, the complex is precipitated at a pH of 1.8 to 5.3, and it is disclosed that when no monocarboxylic acid is added, bismuth hydroxide or bismuth oxide hydrate is deposited in the strongly acidic region of a pH of 1.0 or below; it is disclosed that the bismuth-monocarboxylic acid complex becomes spherical microparticles of crystalline bismuth oxide at 340° C., and bismuth hydroxide or bismuth oxide hydrate becomes rod-shaped bismuth oxide crystals having a nonuniform particle size when heated to 550° C.

PRIOR ART DOCUMENTS

Patent Documents

Patent Document 1: JP-A-63-60112 (JP-A denotes a Japanese unexamined patent application publication)
Patent Document 2: JP-A-07-267643
Patent Document 3: JP-A-01-246140

SUMMARY OF THE INVENTION

Problems to be Solved by the Invention

Accompanying increases in integration and reduction in weight and size of semiconductor chips, with regard to the resin composition for semiconductor sealing described in Patent Document 3, which is called a liquid sealing material, it is known that particles are used that have a large particle size such that, as the particle size of a filler, the average particle size is 1 μm and the maximum particle size is no greater than 10 μm, but there is a possibility that an inorganic ion exchanger having such a large particle size will be inhibited from infiltrating into a confined area within a chip.

Furthermore, the application of bismuth oxide described in Patent Document 3 involves it being a starting material for a calcined material, but it is known that crystalline bismuth oxide is less good than amorphous bismuth oxide as an inorganic ion exchanger in terms of ion exchange rate and exchange capacity, whereas Patent Document 3 discloses a method for producing a bismuth-monocarboxylic acid complex precipitate and crystalline bismuth oxide (III) ($Bi_2O_3$) microparticles, and it does not disclose bismuth compound (BiO(OH)) amorphous microparticles that are preferable as an inorganic anion exchanger or a process for producing same.

Furthermore, the production process of the present invention can produce an amorphous bismuth compound that is in the form of microparticles and has high ion-exchange ability; it is conventionally not known for a precipitation reaction to be carried out at a very high pH of 12, and it is also not known that the bismuth compound obtained by this production method is in the form of microparticles that are conventionally not known and has a high ion exchange ability.

Accompanying the reduction in weight and size of electronic components, new inorganic anion exchangers having a smaller particle size than that of conventional inorganic anion exchanger bismuth compounds and having excellent performance in terms of ion exchange capacity and exchange rate have been desired. Here, it is an object to realize such an inorganic anion exchanger and provide a highly reliable resin composition for electronic component sealing using same.

It is another object of the present invention to provide a process for producing an amorphous bismuth compound that can be used as such an inorganic anion exchanger.

Means for Solving the Problems

The objects have been achieved by means described in <1>, <8>, <10> to <12>, <14>, <15>, <17>, <18>, <20>, and <21> below. They are shown below together with <2> to <7>, <9>, <13>, <16>, <19>, and <22> to <26>, which are preferred embodiments.

<1> An amorphous inorganic anion exchanger, represented by Formula (1), having an average primary particle size observed with an electron microscope of at least 1 nm but no greater than 500 nm, and an $NO_3$ content of no greater than 1 wt % of the whole,

BiO(OH)  (1)

<2> the amorphous inorganic anion exchanger according to <1>, wherein the specific surface area by the BET method is at least 10 m²/g,
<3> the amorphous inorganic anion exchanger according to <1> or <2>, wherein the median diameter on a volume basis measured by a laser diffraction type particle size distribution analyzer is within the range 0.01 μm to 20 μm,
<4> the amorphous inorganic anion exchanger according to any one of <1> to <3>, wherein the maximum particle size measured by a laser diffraction type particle size distribution analyzer is no greater than 20 μm,
<5> the amorphous inorganic anion exchanger according to any one of <1> to <4>, wherein the anion exchange capacity is at least 2.0 meq/g,
<6> the amorphous inorganic anion exchanger according to any one of <1> to <5>, wherein the anion exchange rate at 25° C. for 10 minutes is at least 2.5 meq/g,
<7> the amorphous inorganic anion exchanger according to any one of <1> to <6>, wherein a suspension thereof in deionized water has a supernatant conductivity of no greater than 50 μS/cm,
<8> a resin composition for electronic component sealing, comprising the amorphous inorganic anion exchanger according to any one of <1> to <7>,
<9> the resin composition for electronic component sealing according to <8>, wherein it further comprises an inorganic cation exchanger,
<10> a resin for electronic component sealing that is formed by curing the resin composition for electronic component sealing according to <8> or <9>,
<11> an electronic component that is formed by sealing a device with the resin composition for electronic component sealing according to <8> or <9>,
<12> a varnish comprising the amorphous inorganic anion exchanger according to any one of <1> to <7>,
<13> the varnish according to <12>, wherein it further comprises an inorganic cation exchanger,
<14> an article comprising the varnish according to <12> or <13>,
<15> an adhesive comprising the amorphous inorganic anion exchanger according to any one of <1> to <7>,
<16> the adhesive according to <15>, wherein it further comprises an inorganic cation exchanger,
<17> an article that is adhered by means of the adhesive according to <15> or <16>,
<18> a paste comprising the amorphous inorganic anion exchanger according to any one of <1> to <7>,
<19> the paste according to <18>, wherein it further comprises an inorganic cation exchanger,
<20> an article comprising the paste according to <18> or <19>,
<21> a process for producing an amorphous bismuth compound, comprising a precipitate formation step of forming a precipitate by subjecting an acidic aqueous solution comprising trivalent Bi ions to a temperature in the range of higher than 0° C. but less than 20° C. and a pH of at least 12, the amorphous bismuth compound thus obtained being represented by Formula (1) and having an $NO_3$ content of no greater than 1 wt %,

BiO(OH)  (1)

<22> the process for producing an amorphous bismuth compound according to <21>, wherein it further comprises, subsequent to the precipitate formation step, a washing step of washing the precipitate until the conductivity of the filtrate becomes no greater than 300 μS/cm,
<23> the process for producing an amorphous bismuth compound according to <22>, wherein it further comprises, subsequent to the washing step, a drying step of drying the precipitate until the moisture content thereof becomes no greater than 5 wt %,
<24> the process for producing an amorphous bismuth compound according to any one of <21> to <23>, wherein the precipitate formation step is carried out by a method in which an acidic aqueous solution comprising trivalent Bi ions is poured into an aqueous solution having a pH of at least 12, followed by mixing, <25> the process for producing an amorphous bismuth compound according to any one of <21> to <24>, wherein in the precipitate formation step, an organic acid or an amine is present in the acidic aqueous solution, and <26> the process for producing an amorphous bismuth compound according to <25>, wherein the organic acid or the amine comprises a hydroxydicarboxylic acid.

EXPLANATION OF REFERENCE NUMERALS AND SYMBOLS

Figure 1:
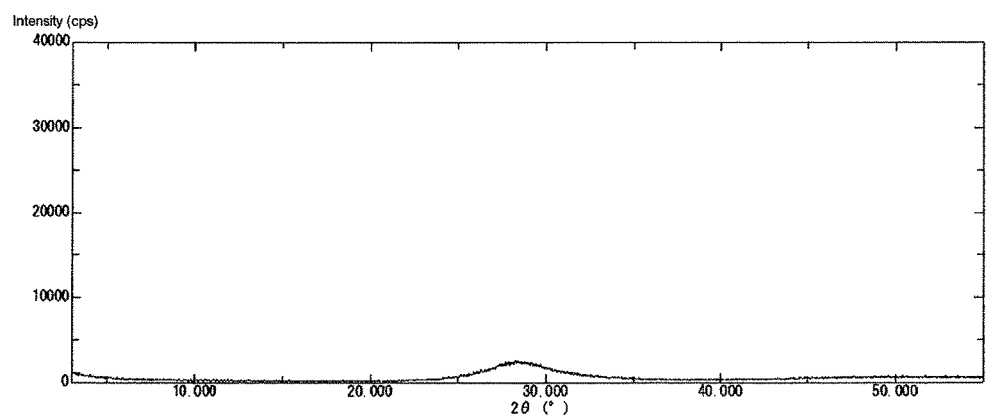
FIG. 1: X ray diffraction pattern of amorphous inorganic anion exchanger 1 produced in Example 1

The ordinate of FIGS. 1 to 10 denotes X ray diffraction intensity (units cps).

The abscissa of FIGS. 1 to 10 denotes diffraction angle $2\theta$ (units °).

MODE FOR CARRYING OUT THE INVENTION

The present invention is explained in detail below. Here, unless otherwise specified, '%' means 'wt %', 'parts' means 'parts by weight', and 'ppm' means 'ppm by weight'. Furthermore, in the present invention, the notation 'lower limit to upper limit' expressing a numerical range means 'at least the lower limit but no greater than the upper limit', and the notation 'upper limit to lower limit' means 'no greater than the upper limit but at least the lower limit'. That is, it denotes a numerical range that includes the upper limit and the lower limit. Furthermore, in the present invention, a combination of two or more preferred embodiments, which are described later, is also a preferred embodiment.

Amorphous Inorganic Anion Exchanger

The amorphous inorganic anion exchanger of the present invention exhibits an amorphous structure in a powder X ray diffraction pattern; the average primary particle size by examination using an electron microscope is at least 1 nm but no greater than 500 nm, and the $NO_3$ content is no greater than 1%.

As shown in Patent Document 2, it can be said that a bismuth compound having a low nitrate ion concentration as in the present invention is conventionally considered to have a low ion exchange rate and poor water resistance as an anion exchanger.

The amorphous inorganic anion exchanger of the present invention is in the form of microparticles and has high anion exchangeability; if it is used in a composition for sealing, it is suitable for sealing an electronic component having wiring with a narrow pitch or a thin coating or film form; it can exhibit an effect in preventing corrosion of metal wiring, it can in addition be used in various applications over a wide range including sealing, covering, and insulation for electronic components or electrical components, and it has an effect in preventing corrosion and enhancing reliability. Moreover, it may also be used as a stabilizer or a corrosion inhibitor for a resin such as polyvinyl chloride.

The process for producing an amorphous bismuth compound of the present invention comprises a precipitate formation step of forming a precipitate by subjecting an acidic aqueous solution comprising trivalent Bi ions to a temperature in the range of higher than 0° C. but less than 20° C. and a pH of at least 12, the amorphous bismuth compound thus obtained being represented by Formula (1) and having an $NO_3$ content of no greater than 1 wt %.

$$BiO(OH) \quad (1)$$

The production process of the present invention easily gives a bismuth compound that exhibits an amorphous structure in a powder X ray diffraction pattern, and has an average primary particle size of no greater than 500 nm, and an $NO_3$ content of no greater than 1%.

An amorphous bismuth compound obtained by the process for producing an amorphous bismuth compound of the present invention may be suitably used as the amorphous inorganic anion exchanger of the present invention.

Furthermore, the amorphous inorganic anion exchanger of the present invention is suitably produced by the process for producing an amorphous bismuth compound of the present invention.

Preferred embodiments of the process for producing an amorphous bismuth compound of the present invention, and the amorphous bismuth compound obtained by said production process are, unless otherwise specified, the same as preferred embodiments of the process for producing an amorphous inorganic anion exchanger of the present invention, and the amorphous inorganic anion exchanger of the present invention, which are described later.

Furthermore, the process for producing an amorphous bismuth compound of the present invention preferably further comprises, subsequent to the precipitate formation step, a washing step of washing the precipitate until the conductivity of the filtrate becomes no greater than 300 μS/cm, and more preferably further comprises, subsequent to the washing step, a drying step of drying the precipitate until the moisture content thereof becomes no greater than 5 wt %.

Powder X Ray Diffraction Pattern

It can be confirmed by powder X ray diffraction analysis that the inorganic anion exchanger of the present invention is amorphous. The powder X ray diffraction analysis may be carried out in accordance with for example the definition of JIS K0131-1996. In the JIS definition, although the applied voltage of an X ray tube is not defined, the standard measurement method for X ray diffraction measurement employs Cu Kα radiation generated at an applied voltage of 50 kV for an X ray tube employing a Cu target and a current value of 120 mA. If a sample contains a crystalline substance, an acute angle-shaped diffraction peak appears in the X ray diffraction chart, the diffraction angle $2\theta$ of the diffraction peak is determined from the powder X ray diffraction chart that is obtained, the plane distance d of the crystal is calculated based on the relationship $\lambda=2d \sin \theta$, and the crystal system can be identified. Here, the $\lambda$ of Cu Kα radiation is 1.5405 angstrom.

When a compound is amorphous, since there is no acute angled peak in the X ray diffraction pattern, it is clear that it does not contain a crystalline component. Even for one that is amorphous, a broad peak is often observed at a diffraction angle 2θ of 20° to 40° in the X ray diffraction pattern, but this does not mean that crystals are present. The strength of the broad peak is less than 10,000 cps (counts per second) at the maximum peak position, preferably no greater than 7,000 cps, and more preferably no greater than 5,000 cps.

If there is an acute angled peak or a broad peak of at least 10,000 cps present between diffraction angles 2θ of 20° to 40°, it means that a crystalline substance is contained. The amorphous inorganic anion exchanger of the present invention preferably does not contain a crystalline substance from the viewpoint of ion exchangeability.

The basic composition of the amorphous inorganic anion exchanger in the present invention is represented by Formula (1).

BiO(OH)    (1)

There can be used in combination with the amorphous inorganic anion exchanger of the present invention an inorganic compound having anion exchangeability other than BiO(OH), and it is preferably one not containing nitrate ion; specific examples include hydrotalcite, hydrated bismuth oxide, hydrated magnesium oxide, and hydrated aluminum oxide. Among them, hydrated bismuth oxide is preferable, and the amount thereof used in combination is preferably no greater than 50% of the entire inorganic anion exchanger, more preferably no greater than 30%, and yet more preferably no greater than 5%.

It is essential for the content of the $NO_3$ (nitrate ion, $NO_3^-$) contained in the amorphous inorganic anion exchanger of the present invention to be no greater than 1%. For example, when $NO_3$ is contained at 1%, the constitution is such that x=0.958 in Formula (2) below; the amorphous inorganic anion exchanger of the present invention may be defined as corresponding to Formula (2) where x=0 to 0.958, but the main component of the amorphous inorganic anion exchanger of the present invention is a compound represented by Formula (1), and $NO_3$ may be defined as an impurity that can be contained if it is no greater than 1%. The content of $NO_3$ is more preferably no greater than 0.5%, yet more preferably no greater than 0.2%, and most preferably 0. It is not preferable for the $NO_3$ content to exceed 1% since there is a possibility that electronic components will be adversely affected.

With regard other impurities that may be contained, there is $H_2O$; the content thereof is preferably no greater than 5%, more preferably no greater than 3%, yet more preferably no greater than 1%, and particularly preferably no greater than 0.5%. $Bi(OH)_3$ may also be contained, and the content thereof is preferably no greater than 3%, more preferably no greater than 1%, and yet more preferably no greater than 0.5%.

$BiO(OH)_x(NO_3)_{1-x}$    (2)

Furthermore, the amorphous inorganic anion exchanger of the present invention comprises a compound represented by Formula (1) in an amount of at least 50 wt %, preferably at least 70 wt %, and more preferably at least 95 wt %.

The specific surface area of the amorphous inorganic anion exchanger of the present invention may be measured by a known method such as the BET method; the specific surface area when measured by the BET method, which involves nitrogen adsorption, is preferably 10 to 100 m²/g, and more preferably 10 to 50 m²/g. When the specific surface area is at least 10 m²/g, the ion capture performance is excellent. On the other hand, when the specific surface area is no greater than 100 m²/g, secondary aggregation can be suppressed, and the occurrence of problems can be prevented.

A starting material for obtaining the amorphous inorganic anion exchanger of the present invention may be any material as long as it is conventionally used as a starting material for obtaining a bismuth compound such as bismuth oxide or bismuth oxyhydroxide by a reaction in aqueous solution. That is, it is one that generates trivalent bismuth ions in aqueous solution; specific examples include bismuth oxychloride, bismuth citrate, bismuth oxyacetate, bismuth oxyperchlorate, bismuth oxysalicylate, bismuth trichloride, bismuth tribromide, bismuth hydroxide, bismuth oxycarbonate, bismuth oxynitrate, bismuth sulfate, and bismuth nitrate, and among them bismuth nitrate is preferable since it is industrially readily available and has good solubility in water. Moreover, it is known that an aqueous solution of these starting materials can be maintained acidic by adding a mineral acid, etc. in order to prevent the precipitation of hydroxide or oxide. Preferred examples of the mineral acid include hydrochloric acid and nitric acid, and nitric acid is more preferable.

The process for producing an amorphous bismuth compound of the present invention comprises a precipitate formation step of forming a precipitate by subjecting an acidic aqueous solution comprising trivalent Bi ions to a temperature in the range of higher than 0° C. but less than 20° C. and a pH of at least 12.

The amorphous inorganic anion exchanger of the present invention may be obtained by a production process comprising a step of forming a precipitate by subjecting an acidic aqueous solution comprising trivalent Bi ions to a temperature in the range of 0° C. to 20° C. and a pH of at least 12.

The pH when forming a precipitate is preferably at least 12, more preferably 12 to 14, yet more preferably 12.3 to 13.5, and particularly preferably 12.7 to 13.3. When the pH is at least 12, it is possible to prevent $NO_3$ from remaining. The pH may be measured by using a pH meter employing a usual glass electrode. The solution temperature when generating this precipitate is preferably higher than 0° C. but lower than 20° C., more preferably higher than 0° C. but lower than 15° C., and yet more preferably higher than 0° C. but lower than 10° C. When this temperature is higher than 0° C., it is possible to prevent ice that will inhibit the reaction from being formed, whereas when it is lower than 20° C., a material having an appropriate particle size is easily obtained.

When producing the amorphous inorganic anion exchanger of the present invention, the material that is used in order to realize a pH of at least 12 is a basic substance; preferred examples include an alkali metal hydroxide, an alkali metal carbonate, an alkali metal bicarbonate, ammonia, and a compound that generates ammonia upon heating (e.g. urea, hexamethylenetetramine, etc.); an alkali metal hydroxide is more preferable, and the alkali metal contained therein is preferably sodium or potassium. These basic substances are preferably made in the form of an aqueous solution in advance in order for them to smoothly mix with the bismuth starting material, and in this case the concentration is preferably higher since the reaction solution is not excessively diluted. The concentration is preferably 1% to the saturation concentration, and more preferably 3% to 20%.

When producing the amorphous inorganic anion exchanger of the present invention, as a method for achieving a pH of at least 12, there can be employed a method in which an acidic aqueous solution containing trivalent bismuth ions is added to a solution of a basic substance or, conversely, a method in which a solution of a basic substance is added to an acidic aqueous solution containing trivalent bismuth ions, etc.; since trivalent bismuth ions are only stably present in a strongly acidic region, the pH of the acidic aqueous solution containing trivalent bismuth ions is preferably no greater than 3, more preferably no greater than 1, and particularly preferably no greater than 0.5. When the pH of such an acidic aqueous solution containing trivalent bismuth ions is gradually increased instead of suddenly being increased to 12 or greater as in the above method, a precipitate starts to form in an acidic region where the pH is less than 7. When the pH is at least 12, a preferred amorphous inorganic anion exchanger is easily obtained.

Because of this, in the process for producing an amorphous inorganic anion exchanger of the present invention, as a method for making the acidic aqueous solution containing trivalent bismuth ions have a pH of at least 12, a method in which the acidic aqueous solution containing trivalent bismuth ions and a solution of a basic substance are added dropwise at the same time while carrying out adjustment so that the pH when mixed becomes at least 12, or a method in which the acidic aqueous solution containing trivalent bismuth ions is added dropwise to a solution having a pH of at least 12 may be employed. Among them, a method in which an acidic aqueous solution containing trivalent bismuth ions is rapidly poured into and mixed with a solution having a pH of at least 12 is preferable. The time for pouring and mixing is preferably within 30 minutes, more preferably within 10 minutes, and yet more preferably within 1 minute. All of these methods are methods in which the pH of the acidic aqueous solution containing trivalent bismuth ions quickly passes through the neutral region and reaches at least 12; it is possible to prevent the formation of $Bi(OH)_3$, etc., which might form around an acidic to neutral region, and an inorganic anion exchanger that is amorphous and has a small particle size can be obtained.

An additive may be used when forming the precipitate. As the additive, an organic acid or an amine may be used. Preferred examples include a dicarboxylic acid, a tricarboxylic acid, and a polyamine, specific examples include oxalic acid, tartaric acid, malic acid, succinic acid, citric acid, ethylenediamine, diethylenetriamine, and triethylenetetramine, and one that reacts in the same way as an amine, such as ethyleneimine or polyethyleneimine, is also included. Among them, a dicarboxylic acid is more preferable; among dicarboxylic acids a hydroxy acid is yet more preferable, and tartaric acid and malic acid are particularly preferable. It is possible, by the use of such an additive, to prevent a precipitate thus deposited from aging, and a bismuth compound that is amorphous and has a small particle size can be obtained. The amount of additive added is preferably 1 to 100 parts relative to 100 parts of trivalent bismuth, and more preferably 3 to 50 parts.

The process for producing the amorphous inorganic anion exchanger of the present invention preferably comprises, within 1 hour after the precipitate formation step of forming a precipitate by subjecting an acidic aqueous solution comprising trivalent Bi ions to a temperature in the range of higher than 0° C. but less than 20° C. and a pH of at least 12, a washing step of washing the precipitate until the conductivity of the filtrate becomes no greater than 300 µS/cm. The reason therefor is because the precipitate formed gradually ages in solution and becomes crystalline; the higher the temperature of the solution, the faster the crystallization progresses, and when ions that can become a starting material for a precipitate component are present in the atmosphere, there is an effect in promoting crystallization of the precipitate component. Crystallization can be suppressed by quickly removing by-products or unreacted starting material by washing. The temperature of deionized water used in washing is preferably higher than 0° C. but no greater than 40° C. It is more preferably higher than 0° C. but no greater than 25° C., and yet more preferably higher than 0° C. but no greater than 15° C. Washing is preferably carried out until the electrical conductivity of the filtrate becomes no greater than 300 µS/cm, and more preferably no greater than 50 µS/cm. Furthermore, the time from formation of a precipitate to completion of washing and then starting drying is preferably within 1 hour, more preferably within 45 minutes, and yet more preferably within 30 minutes.

A precipitate for which washing is completed can be prevented from undergoing crystallization by drying it so as to remove moisture. Drying may be carried out at room temperature or by heating within a drying oven. That is, any treatment may be carried out as long as excess moisture can be removed from the precipitate. For example, the drying temperature in the present invention is preferably −20° C. to 250° C., and more preferably 100° C. to 230° C. A drying method is not particularly limited, but since the amorphous bismuth compound in the present invention is in the form of microparticles that easily aggregate, a preferred drying method is freeze drying, spray drying, etc. Drying is carried out until the moisture content of the entire precipitate becomes preferably no greater than 5%, more preferably no greater than 3%, and yet more preferably no greater than 1%.

The process for producing the amorphous inorganic anion exchanger of the present invention preferably further comprises, subsequent to the washing step, a drying step of drying the precipitate until the moisture content thereof becomes no greater than 5%.

The amorphous inorganic anion exchanger of the present invention obtained as above may be subjected to a grinding treatment according to the intended application, thus giving a desired secondary particle size.

The secondary particle size of the amorphous inorganic anion exchanger of the present invention is not particularly limited; for example, it may be dispersed in deionized water by ultrasound, and subjected to measurement using a laser diffraction type particle size distribution analyzer, the median diameter determined on a volume basis being used as a representative value for the secondary particle size. The secondary particle size is preferably 0.01 to 20 µm, more preferably 0.05 to 20 µm, and yet more preferably 0.1 to 10.0 µm. When the secondary particle size is at least 0.01 µm, re-aggregation can be suppressed, and when it is no greater than 20 µm, it is possible to suppress the occurrence of problems due to particulates or clogging when it is used by adding to a resin to form a thin film or coating.

In the same manner, the maximum particle size of the amorphous inorganic anion exchanger measured by a laser diffraction type particle size distribution analyzer is also important, and the maximum particle size is preferably no greater than 20 µm, more preferably no greater than 10 µm, and yet more preferably no greater than 5 µm. A preferred lower limit is at least 0.01 µm. When the maximum particle size is no greater than 20 µm, it is possible to suppress the occurrence of problems due to particulates or clogging when it is used by adding to a resin to form a thin film or coating.

The primary particle size of the amorphous inorganic anion exchanger of the present invention is an important parameter that affects the specific surface area and the ion exchange rate; the size is determined by the precipitation reaction from solution, but the value cannot be changed by grinding. The primary particle size may be determined by magnifying and examining particles using a scanning or transmission electron microscope, measuring the major diameter of for example 100 particles selected in the visual field, and calculating the number-average value. The average primary particle size thus obtained is essentially at least 1 nm but no greater than 500 nm, preferably at least 10 nm but no greater than 300 nm, and more preferably at least 30 nm but no greater than 200 nm. When the average primary particle size exceeds 500 nm, ion capture performance is not sufficiently exhibited or processing into a film or a sheet becomes difficult.

Furthermore, the average primary particle size of the amorphous bismuth compound obtained by the process for producing the amorphous bismuth compound of the present invention is preferably at least 1 nm but no greater than 500 nm, more preferably at least 10 nm but no greater than 300 nm, and yet more preferably at least 30 nm but no greater than 200 nm.

Anion Exchange Capacity

The anion exchange capacity of the amorphous inorganic anion exchanger of the present invention may be measured using hydrochloric acid. As a specific measurement example, a 100 mL polyethylene bottle is charged with 1 g of an inorganic anion exchanger and 50 mL of 0.1 mol/liter hydrochloric acid and shaken at 40° C. for 24 hours, subsequently the chloride ion concentration of the supernatant is measured by ion chromatography, the chloride ion concentration measured by repeating the same procedure without adding the inorganic anion exchanger is defined as a blank value, and the difference may be defined as the anion exchange capacity per g of the inorganic anion exchanger.

The anion exchange capacity of the amorphous inorganic anion exchanger of the present invention is preferably at least 2.0 meq/g, more preferably at least 2.5 meq/g, and yet more preferably at least 3.0 meq/g, a preferred upper limit being no greater than 10 meq/g. The reason why this range is preferable is because when applied to an electronic component sealing agent the addition of a small amount can give a sufficient effect.

Anion Exchange Rate

The anion exchange rate of the amorphous inorganic anion exchanger of the present invention is an index for the ion exchange rate obtained by measuring the amount of ions exchanged while shaking for 10 minutes instead of 24 hours in measurement of the anion exchange capacity described above. The larger the ion exchange rate, the more preferable it is, and it is preferably at least 2.5 meq/g, more preferably at least 3.0 meq/g, and yet more preferably at least 3.2 meq/g, a preferred upper limit being no greater than 5 meq/g.

Conductivity

A measurement of the conductivity of the supernatant when the amorphous inorganic anion exchanger of the present invention is added to deionized water, stirred, and allowed to settle is defined as the conductivity of the present invention. When the conductivity shows a large value, it means that an ionic substance has leached out, and it is therefore preferable for the conductivity to be low. Specifically, it may be determined by charging a 100 mL volume polypropylene bottle with 0.5 g of an inorganic anion exchanger and 50 mL of deionized water, maintaining it at 95° C. for 20 hours, and then measuring the conductivity of the supernatant using a conductivity meter.

The conductivity of the amorphous inorganic anion exchanger of the present invention is preferably no greater than 50 μS/cm, more preferably no greater than 40 μS/cm, and yet more preferably no greater than 30 μS/cm, a preferred lower limit being at least 0.1 μS/cm.

With regard to the anion exchanger of the present invention, when the conductivity is in the above range, if it is applied to electronic component sealing, etc., the addition of a small amount can give a sufficient effect.

For example, when the amorphous inorganic anion exchanger of the present invention is used as an electronic component sealing agent, an excellent effect in preventing wiring corrosion can be expected by the use of one having an anion exchange capacity of at least 2.0 meq/g and a conductivity of no greater than 50 μS/cm.

Resin Composition for Electronic Component Sealing

The resin composition for electronic component sealing of the present invention is a resin composition comprising the amorphous inorganic anion exchanger of the present invention.

With regard to a resin used in the resin composition for electronic component sealing to which the amorphous inorganic anion exchanger of the present invention is added, it may be a thermosetting resin such as a phenolic resin, a urea resin, a melamine resin, an unsaturated polyester resin, or an epoxy resin, or a thermoplastic resin such as polyethylene, polystyrene, vinyl chloride, or polypropylene; a silicone-based resin that is set at normal temperature may also be used, and a thermosetting resin is preferable. The thermosetting resin used in the resin composition for electronic component sealing of the present invention is preferably a phenolic resin or an epoxy resin, and particularly preferably an epoxy resin, and in this case it is called an epoxy resin composition for electronic component sealing.

Epoxy Resin Composition for Electronic Component Sealing

An epoxy resin used in the epoxy resin composition for electronic component sealing is not particularly limited as long as it is one that is normally used in a resin for electronic component sealing. For example, one that has two or more epoxy groups per molecule and that can be cured may be used regardless of the type, and any resin used as a molding material such as a phenol/novolac epoxy resin, a bisphenol A epoxy resin, a bisphenol F epoxy resin, or an alicyclic epoxy resin may be used. Furthermore, in order to enhance the moisture resistance of the composition of the present invention, as the epoxy resin one having a chloride ion content of no greater than 10 ppm and a hydrolyzable chlorine content of no greater than 1,000 ppm is preferably used.

In the present invention, the epoxy resin composition for electronic component sealing preferably comprises a curing agent and a curing accelerator.

As the curing agent used in the present invention any curing agent that is known as one for an epoxy resin composition can be used, and specific preferred examples include an acid anhydride, an amine-based curing agent, and a novolac curing agent.

As the curing accelerator used in the present invention, any curing accelerator known as one for an epoxy resin composition can be used, and specific preferred examples include amine-based, phosphorus-based, and imidazole-based accelerators.

The resin composition for electronic component sealing of the present invention may comprise a known component that is added to a molding resin as necessary. Examples of this component include an inorganic filler, a flame retardant, a coupling agent for an inorganic filler, a colorant, and a mold release agent. All of these components are known as components that are added to an epoxy resin for molding. Specific preferred examples of the inorganic filler include crystalline silica powder, quartz glass powder, fused silica powder, alumina powder, and talc, and among them crystalline silica powder, quartz glass powder, and fused silica powder are preferable due to low cost. Examples of the flame retardant include antimony oxide, a halogenated epoxy resin, magnesium hydroxide, aluminum hydroxide, a red phosphorus-based compound, and a phosphoric acid ester-based compound, examples of the coupling agent include silane-based and titanium-based ones, and examples of the mold release agent include waxes such as an aliphatic paraffin and a higher aliphatic alcohol.

In addition to the above components, a reactive diluent, a solvent, a thixotropy-imparting agent, etc. may be contained. Specific examples include butylphenyl glycidyl ether as a reactive diluent, methyl ethyl ketone as a solvent, and an organic-modified bentonite as a thixotropy-imparting agent.

The proportion of the amorphous inorganic anion exchanger of the present invention added to the resin composition for electronic component sealing is preferably 0.1 to 10 parts relative to 100 parts of the resin composition for electronic component sealing, and more preferably 1 to 5 parts. When it is at least 0.1 parts, the effect in enhancing anion removability and moisture resistance reliability is excellent, whereas when it is no greater than 10 parts, it is excellent in terms of cost while achieving a sufficient effect.

Although the amorphous inorganic anion exchanger of the present invention is an inorganic anion exchanger, the combined use of an inorganic cation exchanger increases the anion capture performance, as an inorganic anion exchanger, of the amorphous inorganic anion exchanger of the present invention, and cation capture performance can also be expected. The inorganic cation exchanger is an inorganic substance and a substance having cation exchangeability, and specific examples include antimonic acid (hydrated antimony pentoxide), niobic acid (hydrated niobium pentoxide), manganese oxide, zirconium phosphate, titanium phosphate, tin phosphate, cerium phosphate, zeolite, and a clay mineral, and antimonic acid (hydrated antimony pentoxide), zirconium phosphate, and titanium phosphate are preferable.

The mixing ratio when the amorphous inorganic anion exchanger of the present invention and an inorganic cation exchanger are used in combination is not particularly limited, but it is preferably 100:0 to 20:80 as a ratio by weight. The amorphous inorganic anion exchanger of the present invention and an inorganic cation exchanger may be separately added when producing a resin composition for electronic component sealing, or they may be uniformly mixed in advance and then added. It is preferable to employ a mixture. By so doing, an effect due to the combined use of these components can further be exhibited.

The resin composition for electronic component sealing of the present invention may be easily obtained by mixing the starting materials using a known method; for example, the starting materials are appropriately mixed, and this mixture is kneaded in a kneader in a heated state to give a semi-cured resin composition, this is cooled to room temperature, ground by known means, and tabletted as necessary, thus giving a solid composition that is a so-called molding compound, or it may be obtained as a liquid sealing agent.

The amorphous inorganic anion exchanger of the present invention can be used in various applications such as sealing, covering, and insulation of an electronic component or an electrical component. Furthermore, the amorphous inorganic anion exchanger of the present invention may be used in a stabilizer, a corrosion inhibitor, etc. for a resin such as vinyl chloride.

The resin composition for electronic component sealing to which the amorphous inorganic anion exchanger of the present invention is added may be used in a case in which a device such as an active device such as a semiconductor chip, a transistor, a diode, or a thyristor or a passive device such as a capacitor, a resistor, or a coil is mounted on a support member such as a lead frame, a wired tape carrier, a wiring board, glass, or a silicon wafer. Furthermore, the resin composition for electronic component sealing of the present invention may also be used effectively for a printed circuit board. An epoxy resin composition for electronic component sealing to which the amorphous inorganic anion exchanger of the present invention is added may also be used in the same manner.

As a method for sealing a device using the resin composition for electronic component sealing of the present invention or the epoxy resin composition for electronic component sealing, a low pressure transfer molding method is the most common, but an injection molding method, a compression molding method, etc. may also be used. An inorganic cation exchanger may also be added thereto.

Application to Wiring Boards

A printed wiring board is prepared using a thermoset such as an epoxy resin, a copper foil, etc. is adhered thereto, and this is subjected to etching, etc. to thus produce a circuit, thereby producing a wiring board. However, in recent years, due to the increasing density of circuits, layering of circuits, and thinner films of insulation layers, etc. there are problems with corrosion or poor insulation. When producing a wiring board, by the addition of the amorphous inorganic anion exchanger of the present invention such corrosion can be prevented. Furthermore, by the addition of the amorphous inorganic anion exchanger of the present invention to an insulation layer for a wiring board, corrosion, etc. of the wiring board can be prevented. Because of the above, with regard to the wiring board comprising the amorphous inorganic anion exchanger of the present invention, it is possible to suppress the occurrence of defective products due to corrosion, etc. It is preferable to add 0.1 to 5 parts of the amorphous inorganic anion exchanger of the present invention to 100 parts of the resin solids content in the wiring board or the insulation layer for a wiring board. An inorganic cation exchanger may also be added thereto.

Mixing into Adhesive

An electronic component, etc. is mounted on a substrate such as a wiring board using an adhesive. By adding the amorphous inorganic anion exchanger of the present invention to the adhesive used here, it is possible to suppress the occurrence of defective products due to metal corrosion, etc. It is preferable to add 0.1 to 5 parts of the amorphous inorganic anion exchanger of the present invention to 100 parts of the resin solids content in the adhesive.

By adding the amorphous inorganic anion exchanger of the present invention to a conductive adhesive, etc. used when connecting or wiring an electronic component, etc. to a wiring board, it is possible to suppress the occurrence of defective products due to corrosion, etc. Examples of this conductive adhesive include one containing a conductive metal such as silver. It is preferable to add 0.1 to 5 parts of the amorphous inorganic anion exchanger of the present invention to 100 parts of the resin solids content in the conductive adhesive. An inorganic cation exchanger may also be added thereto.

Mixing into Varnish

An electrical product, a printed wiring board, an electronic component, etc. may be produced using a varnish comprising the amorphous inorganic anion exchanger of the present invention. Examples of this varnish include one containing as a main component a thermosetting resin such as an epoxy resin. It is preferable to add 0.1 to 5 parts of the amorphous inorganic anion exchanger of the present invention to 100 parts of the resin solids content. An inorganic cation exchanger may also be added thereto.

Mixing into Paste

The amorphous inorganic anion exchanger of the present invention may be added to a paste comprising a silver powder, etc. A paste is used as a soldering, etc. adjuvant for improving the adhesion between connecting metal pieces. This can suppress the occurrence of corrosive substances in a paste. Examples of the paste include a conductive paste such as a soldering paste, a silver paste, or a copper paste. It is preferable to add 0.1 to 5 parts of the amorphous inorganic anion exchanger of the present invention to 100 parts of the resin solids content in the paste. An inorganic cation exchanger may also be added thereto.

In accordance with the present invention, there can be provided an amorphous inorganic anion exchanger having excellent anion exchangeability and suppressed corrosivity toward metals.

Furthermore, in accordance with the present invention, there can be provided a production process for producing an amorphous bismuth compound having excellent anion exchangeability and suppressed corrosivity toward metals.

EXAMPLES

The present invention is explained in further detail below by reference to Examples and Comparative Examples, but the present invention should not be construed as being limited thereto. In addition, % is wt %, parts are parts by weight, and ppm is ppm by weight. The constitution of an inorganic anion exchanger was determined by the method below.

(1) An inorganic anion exchanger was dissolved in nitric acid, and the bismuth content was measured by ICP (inductively coupled plasma emission spectrometer). (2) 0.5 g of an inorganic anion exchanger was added to 50 mL of a 0.1N aqueous solution of sodium hydroxide, and treatment was carried out at 95° C. for 20 hours. The nitrate ion concentration in the treated liquid was measured by ion chromatography, thus obtaining the nitrate ion content. From these two measurement results, the constitution of the inorganic anion exchanger was determined.

With regard to powder X ray diffraction (XRD) measurement, an X ray diffraction pattern was obtained using Cu Kα generated using an RINT2400V model manufactured by Rigaku Corporation with a Cu target X ray tube at an applied voltage of 50 kV and a current value of 120 mA. It was checked whether or not the inorganic ion exchanger produced had an acute angled peak or a broad peak with a diffraction intensity of 10,000 cps or greater. Furthermore, change in weight when heating up to 1,000° C. in air at 20° C./min was measured using TG-DTA thermal analysis equipment (thermogravimetric/differential thermal analysis measurement equipment). When the inorganic ion exchanger produced has the constitution of Formula (1), the reaction of Formula (5) below proceeds upon heating, thus causing a reduction in weight of 3.7% as a calculated value as a result of dehydration-condensation and conversion into $Bi_2O_3$.

$$2BiO(OH) \rightarrow Bi_2O_3 + H_2O \qquad (5)$$

The result of thermal analysis showed in all cases that there was a reduction in weight at a temperature of no greater than 110° C., which seemed to be caused by the evaporation of attached water, but in the Examples there was a stepwise reduction in weight in going from 250° C. to 350° C. It was therefore concluded that those for which the reduction in weight between 110° C. and 1,000° C. was around 3.7% (3.2% to 4.2%) of the entire solids excluding attached water, which were amorphous before heating, and which were confirmed by powder X ray diffraction to be α-$Bi_2O_3$ crystals after heating to 1,000° C., were BiO(OH) as defined by Formula (1) or Formula (2). All of Example 1 to Example 7 below satisfied these conditions.

Example 1

530 g of a 5% aqueous solution of sodium hydroxide was cooled to 5° C. Furthermore, 60 g of a 50% aqueous solution of bismuth nitrate was diluted with 200 g of 5% nitric acid, and cooled to 5° C.

The aqueous solution of sodium hydroxide prepared was placed in a 1 L beaker and stirred at 400 rpm while cooling at 5° C. (pH=14). The entire amount of the cooled bismuth aqueous solution was added thereto within 1 minute using a funnel. The pH of the slurry after the dropwise addition was 13.0.

The precipitate thus obtained was immediately filtered, and the precipitate was washed with deionized water at 10° C. until the conductivity of the filtrate became no greater than 50 μS/cm. Filtration and washing were completed in 30 minutes. This precipitate was dried at 120° C. for 24 hours. Subsequently it was ground using a Fritsch Rotor-Speed Mill to give amorphous inorganic anion exchanger (amorphous bismuth compound) 1. This compound was subjected to ICP analysis, thus determining the Bi concentration, and from the result of anion measurement by ion chromatography it was found that this compound was BiO(OH), and the $NO_3$ content was 0.6%. Moreover, this compound was subjected to powder X ray diffraction (XRD) measurement. This diffraction pattern is shown in FIG. 1. There was no sharp peak due to crystalline material, and it was thus confirmed that it was amorphous.

<Measurement of Primary Particle Size>

Amorphous inorganic anion exchanger 1 thus obtained was examined using a model S-4800 scanning electron microscope (SEM) manufactured by Hitachi, Ltd., and 100 randomly selected particles were measured for major diameter. The number-average value was defined as the average primary particle size. This result is shown in Table 1.

<Measurement of Specific Surface Area>

0.1 g of amorphous inorganic anion exchanger 1 thus obtained was subjected to measurement of BET specific surface area by an 'AUTOSORB-1' manufactured by Malvern. This result is shown in Table 1.

<Measurement of Secondary Particle Size and Maximum Particle Size>

0.1 g of amorphous inorganic anion exchanger 1 thus obtained was dispersed in 10 mL of deionized water and dispersed by 70 W ultrasound for 30 seconds. This slurry was subjected to measurement of particle size distribution using a Malvern Mastersizer 2000 laser diffraction type particle size distribution analyzer. Median diameter and maximum value on a volume basis of this measurement value were defined as the secondary particle size and the maximum particle size respectively. These results are shown in Table 1.

<Measurement Test for Anion Exchange Capacity>

A 100 mL polyethylene bottle was charged with 1.0 g of amorphous inorganic anion exchanger 1, further charged with 50 mL of 0.1 mol/liter hydrochloric acid, sealed, and shaken at 25° C. for 24 hours. Subsequently, this solution was filtered using a membrane filter with a pore size of 0.1 μm, and the chloride ion concentration in the filtrate was measured by ion chromatography. The anion exchange capacity was determined by comparing this with the chloride ion concentration measured by the same procedure but without adding any solids content. This result is shown in Table 1.

<Measurement of Anion Exchange Rate>

A 100 mL polyethylene bottle was charged with 1.0 g of amorphous inorganic anion exchanger 1, further charged with 50 mL of 0.1 mol/liter hydrochloric acid, sealed, and shaken at 25° C. for 10 minutes. Immediately thereafter, this solution was filtered using a membrane filter with a pore size of 0.1 μm, and the chloride ion concentration in the filtrate was measured by ion chromatography. The ion exchange capacity was determined by comparing this with the chloride ion concentration measured by the same procedure without adding any solids content, and this value was defined as the anion exchange rate. This result is shown in Table 1.

<Measurement of Conductivity of Supernatant>

A 100 mL polypropylene bottle was charged with 0.5 g of amorphous inorganic anion exchanger 1, further charged with 50 mL of deionized water, sealed, and maintained at 95° C. for 20 hours (a small hole was bored in the bottle in order to prevent explosion). 20 hours later, it was cooled, the supernatant was collected by decantation and filtered using a 0.1 μm membrane filter, and the conductivity of the filtrate was then measured as the conductivity of the supernatant. This result is shown in Table 1.

Example 2

530 g of a 10% aqueous solution of sodium hydroxide was cooled to 5° C. Furthermore, 180 g of a 50% aqueous solution of bismuth nitrate was diluted with 420 g of 5% nitric acid. 2.8 g of tartaric acid was added thereto, dissolved, and cooled to 5° C. The aqueous solution of sodium hydroxide prepared was placed in a 2 L beaker and stirred at 400 rpm while cooling at 5° C. (pH=14). The entire amount of the cooled bismuth aqueous solution was added thereto within 1 minute using a funnel. The pH of the slurry after the dropwise addition was 13.2. The precipitate thus obtained was immediately filtered and washed with deionized water at 10° C. until the conductivity of the filtrate became no greater than 50 μS/cm. Filtration and washing were completed in 30 minutes. This precipitate was dried at 120° C. for 24 hours. Subsequently, it was ground to give amorphous inorganic anion exchanger (amorphous bismuth compound) 2. When this compound was analyzed, it was found to be BiO(OH), and the $NO_3$ content was 0.2%.

Figure 2:
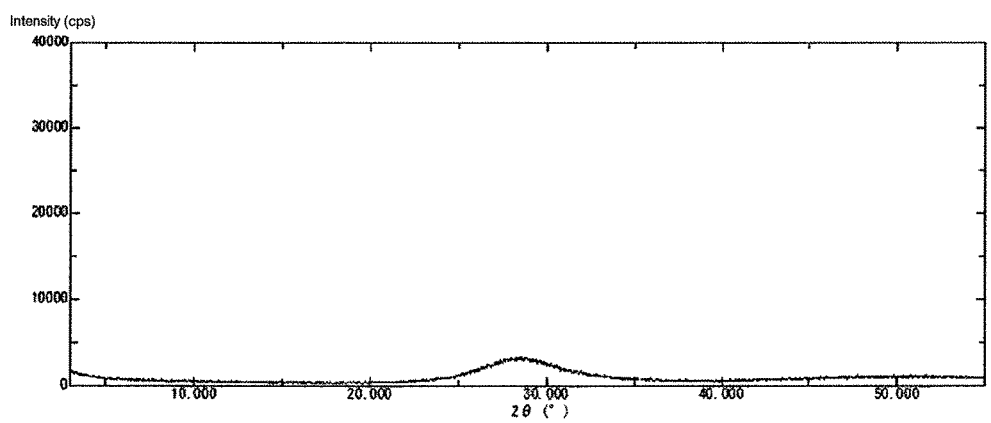
FIG. 2: X ray diffraction pattern of amorphous inorganic anion exchanger 2 produced in Example 2

Amorphous inorganic anion exchanger 2 was subjected to powder X ray diffraction (XRD) measurement. This diffraction pattern is shown in FIG. 2. There was no sharp peak due to crystalline material, and it was thus confirmed that it was amorphous. As in Example 1, amorphous inorganic anion exchanger 2 was subjected to measurement of primary particle size, secondary particle size, maximum particle size, specific surface area, ion exchange capacity, ion exchange rate, supernatant conductivity, etc., and these results are shown in Table 1.

Example 3

530 g of a 10% aqueous solution of sodium hydroxide was cooled to 10° C. Furthermore, 180 g of a 50% aqueous solution of bismuth nitrate was diluted with 420 g of 5% nitric acid. 2.8 g of tartaric acid was added thereto, dissolved, and cooled to 10° C. The aqueous solution of sodium hydroxide prepared was placed in a 2 L beaker and it was stirred at 400 rpm while cooling at 10° C. (pH=14). The entire amount of the cooled bismuth aqueous solution was added thereto within 1 minute using a funnel. The pH of the slurry after the dropwise addition was 13.2. The precipitate thus obtained was immediately filtered and washed with deionized water at 10° C. until the conductivity of the filtrate became no greater than 50 μS/cm. Filtration and washing were completed in 30 minutes. This precipitate was dried at 120° C. for 24 hours. Subsequently, it was ground to give amorphous inorganic anion exchanger (amorphous bismuth compound) 3. When this compound was analyzed, it was found to be BiO(OH), and the $NO_3$ content was 0.2%.

Amorphous inorganic anion exchanger 3 was subjected to powder X ray diffraction (XRD) measurement; as in Examples 1 and 2 there was no sharp peak due to crystalline material, and it was thus confirmed that it was amorphous. As in Example 1, amorphous inorganic anion exchanger 3 was subjected to measurement of primary particle size, secondary particle size, maximum particle size, specific surface area, ion exchange capacity, ion exchange rate, supernatant conductivity, etc., and these results are shown in Table 1.

Example 4

530 g of a 10% aqueous solution of sodium hydroxide was cooled to 10° C. Furthermore, 180 g of a 50% aqueous solution of bismuth nitrate was diluted with 420 g of 5% nitric acid. 2.8 g of tartaric acid was added thereto, dissolved, and cooled to 10° C. The aqueous solution of sodium hydroxide prepared was placed in a 2 L beaker and it was stirred at 400 rpm while cooling at 10° C. (pH=14). The entire amount of the cooled bismuth aqueous solution was added thereto at a speed of 20 mL/min using a roller pump over about 30 minutes. The pH of the slurry after the dropwise addition was 13.2. The precipitate thus obtained was immediately filtered and washed with deionized water at 10° C. until the conductivity of the filtrate became no greater than 50 μS/cm. Filtration and washing were completed in 30 minutes.

This precipitate was dried at 120° C. for 24 hours. Subsequently, it was ground to give amorphous inorganic anion exchanger (amorphous bismuth compound) 4. When this compound was analyzed, it was found to be BiO(OH), and the $NO_3$ content was 0.2%. Amorphous inorganic anion exchanger 4 was subjected to powder X ray diffraction (XRD) measurement; as in Examples 1 and 2 there was no sharp peak due to crystalline material, and it was thus confirmed that it was amorphous. As in Example 1, amorphous inorganic anion exchanger 4 was subjected to measurement of primary particle size, secondary particle size, maximum particle size, specific surface area, ion exchange capacity, ion exchange rate, supernatant conductivity, etc., and these results are shown in Table 1.

Example 5

530 g of a 10% aqueous solution of sodium hydroxide was cooled to 17° C. Furthermore, 180 g of a 50% aqueous solution of bismuth nitrate was diluted with 420 g of 5% nitric acid. 2.8 g of tartaric acid was added thereto, dissolved, and cooled to 10° C. The aqueous solution of sodium hydroxide prepared was placed in a 2 L beaker and it was stirred at 400 rpm while cooling at 17° C. (pH=14). The entire amount of the cooled bismuth aqueous solution was added thereto at a speed of 20 mL/min using a roller pump over about 30 minutes. The pH of the slurry after the dropwise addition was 13.2. The precipitate thus obtained was immediately filtered and washed with deionized water at 10° C. until the conductivity of the filtrate became no greater than 50 µS/cm. Filtration and washing were completed in 30 minutes.

This precipitate was dried at 120° C. for 24 hours. Subsequently, it was ground to give amorphous inorganic anion exchanger (amorphous bismuth compound) 5. When this compound was analyzed, it was found to be BiO(OH), and the $NO_3$ content was 0.2%. Amorphous inorganic anion exchanger 5 was subjected to powder X ray diffraction (XRD) measurement; as in Examples 1 and 2 there was no sharp peak due to crystalline material, and it was thus confirmed that it was amorphous. As in Example 1, amorphous inorganic anion exchanger 5 was subjected to measurement of primary particle size, secondary particle size, maximum particle size, specific surface area, ion exchange capacity, ion exchange rate, supernatant conductivity, etc., and these results are shown in Table 1.

Example 6

530 g of a 10% aqueous solution of sodium hydroxide was cooled to 10° C. Furthermore, 180 g of a 50% aqueous solution of bismuth nitrate was diluted with 420 g of 5% nitric acid. 2.35 g of oxalic acid dihydrate was added thereto, dissolved, and cooled to 10° C. The aqueous solution of sodium hydroxide prepared was placed in a 2 L beaker and it was stirred at 400 rpm while cooling at 10° C. (pH=14). The entire amount of the cooled bismuth aqueous solution was added thereto at a speed of 20 mL/min using a roller pump over about 30 minutes. The pH of the slurry after the dropwise addition was 13.1. The precipitate thus obtained was immediately filtered and washed with deionized water at 10° C. until the conductivity of the filtrate became no greater than 50 µS/cm. Filtration and washing were completed in 30 minutes.

This precipitate was dried at 120° C. for 24 hours. Subsequently, it was ground to give amorphous inorganic anion exchanger (amorphous bismuth compound) 6. When this compound was analyzed, it was found to be BiO(OH), and the $NO_3$ content was 0.2%. Amorphous inorganic anion exchanger 6 was subjected to powder X ray diffraction (XRD) measurement; as in Examples 1 and 2 there was no sharp peak due to crystalline material, and it was thus confirmed that it was amorphous. As in Example 1, amorphous inorganic anion exchanger 6 was subjected to measurement of primary particle size, secondary particle size, maximum particle size, specific surface area, ion exchange capacity, ion exchange rate, supernatant conductivity, etc., and these results are shown in Table 1.

Example 7

200 g of deionized water and 40.0 g of polyethyleneimine (molecular weight 600) were charged into a 1 L beaker, dissolved, and maintained at 15° C. Meanwhile, 200 g of deionized water and 10.0 g of 71%-$HNO_3$ were charged into a 500 mL beaker, 20.83 g of 50%-$Bi(NO_3)_3 \cdot 5H_2O$ manufactured by Nihon Kagaku Sangyo Co., Ltd. was further added slowly thereto and uniformly stirred, and the liquid temperature was maintained at 15° C. Furthermore, 500 g of a 10% aqueous solution of potassium hydroxide was prepared and maintained at 15° C. The aqueous solution of polyethyleneimine in the 1 L beaker was stirred at 400 rpm, and the aqueous solution of bismuth nitrate was added dropwise thereto at 20 mL/min using a roller pump. Simultaneously, the 10% aqueous solution of potassium hydroxide was added dropwise while regulating the flow rate so that the pH of the solution within the 1 L beaker became 12.5. When the aqueous solution of bismuth nitrate was used up, dropwise addition of the 10% aqueous solution of potassium hydroxide was completed. A precipitate was found in the mixture in the 1 L beaker, quickly filtered, and washed with deionized water at 15° C. until the conductivity of the filtrate became no greater than 50 µS/cm. Filtration and washing were completed in 30 minutes. The precipitate thus obtained was dried at 120° C. for 24 hours. Subsequently, it was ground to give amorphous inorganic anion exchanger (amorphous bismuth compound) 7. When this compound was analyzed, it was found to be BiO(OH), and the $NO_3$ content was 0.7%. Amorphous inorganic anion exchanger 7 was subjected to powder X ray diffraction (XRD) measurement; as in Examples 1 and 2 there was only a broad peak at 20° to 40°, with no sharp peak due to crystalline material, and it was thus confirmed that it was amorphous. As in Example 1, amorphous inorganic anion exchanger 7 was subjected to measurement of primary particle size, secondary particle size, maximum particle size, specific surface area, ion exchange capacity, ion exchange rate, supernatant conductivity, etc., and these results are shown in Table 1.

Comparative Example 1

530 g of a 5% aqueous solution of sodium hydroxide was maintained at 25° C. Furthermore, 60 g of a 50% aqueous solution of bismuth nitrate was diluted with 200 g of 5% nitric acid and maintained at 25° C. The aqueous solution of sodium hydroxide prepared was charged into a 1 L beaker and stirred at 400 rpm and 25° C. (pH=14). The entire amount of the aqueous solution of bismuth was added thereto within 1 minute using a funnel. The pH of the slurry after the dropwise addition was 13.0. After the precipitate thus obtained was stored at 25° C. for 24 hours it was filtered and washed with deionized water at 25° C. until the conductivity of the filtrate became no greater than 50 µS/cm. This precipitate was dried at 120° C. for 24 hours. Subsequently, it was ground to give Comparative compound 1. When this compound was analyzed, it was found to be $Bi_2O_3$, and the $NO_3$ content was 0.6%.

Figure 3:
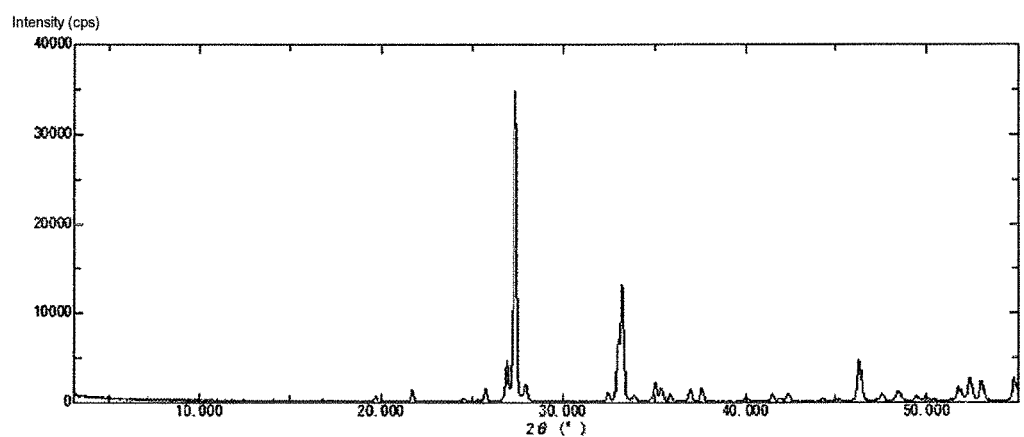
FIG. 3: X ray diffraction pattern of Comparative compound 1 produced in Comparative Example 1

Comparative compound 1 was subjected to powder X ray diffraction (XRD) measurement. This diffraction pattern is shown in FIG. 3. The powder X ray diffraction pattern of Comparative compound 1 coincided with the known diffraction peak pattern of $\alpha$-$Bi_2O_3$. As in Example 1, Comparative compound 1 was subjected to measurement of primary particle size, secondary particle size, maximum particle size, specific surface area, ion exchange capacity, ion exchange rate, supernatant conductivity, etc., and these results are shown in Table 2.

Comparative Example 2

180 g of a 50% aqueous solution of bismuth nitrate was diluted with 420 g of 5% nitric acid and maintained at 25°

C. and, while stirring, a 10% aqueous solution of sodium hydroxide was added dropwise thereto at a speed of 20 mL/min using a roller pump until the pH became 13.0; a precipitate started to form at a pH of around 1.0. The precipitate thus obtained was immediately filtered and washed with deionized water at 25° C. until the conductivity of the filtrate became no greater than 50 µS/cm. Filtration and washing were completed in 30 minutes. This precipitate was dried at 120° C. for 24 hours. Subsequently, it was ground to give Comparative compound 2. When this compound was analyzed, it was found that the composition was $Bi_2O_3$, and the $NO_3$ content was 0.4%.

Figure 4:
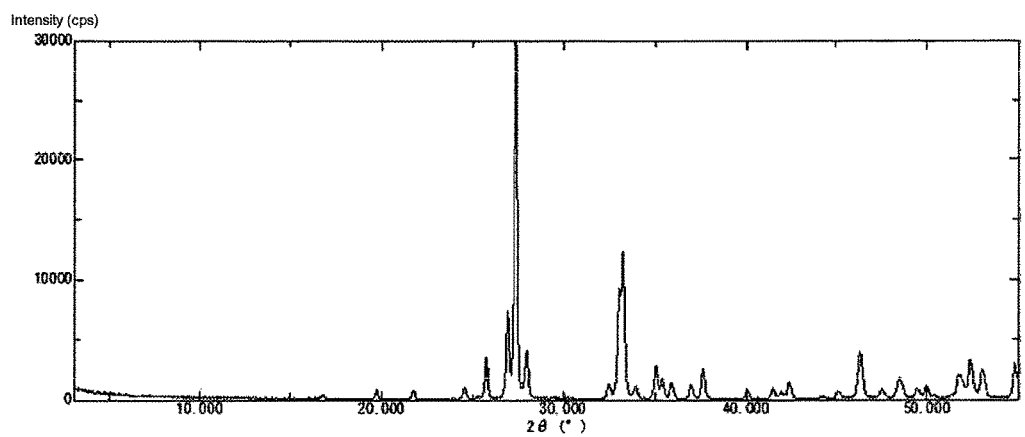
FIG. 4: X ray diffraction pattern of Comparative compound 2 produced in Comparative Example 2

Comparative compound 2 was subjected to powder X ray diffraction (XRD) measurement. This diffraction pattern is shown in FIG. 4. The powder X ray diffraction pattern of Comparative compound 2 coincided with the known diffraction pattern of $\alpha$-$Bi_2O_3$ in terms of peak position. As in Example 1, Comparative compound 2 was subjected to measurement of primary particle size, secondary particle size, maximum particle size, specific surface area, ion exchange capacity, ion exchange rate, supernatant conductivity, etc., and these results are shown in Table 2.

Comparative Example 3

180 g of a 50% aqueous solution of bismuth nitrate was diluted with 420 g of 5% nitric acid, and 2.8 g of tartaric acid was further added, dissolved, and cooled to 5° C. It was maintained at 5° C. and, while stirring, a 10% aqueous solution of sodium hydroxide was added dropwise thereto at a speed of 20 mL/min using a roller pump until the pH became 13.0; a precipitate started to form at a pH of around 1.0

Figure 5:
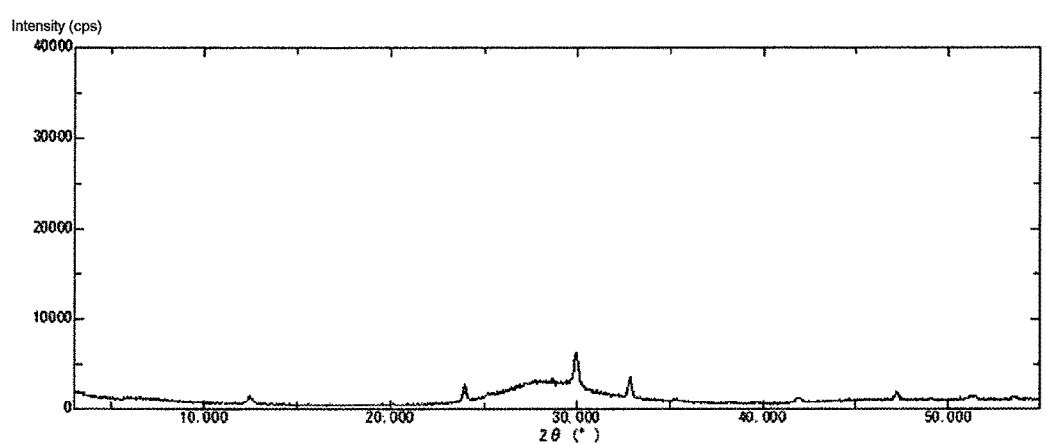
FIG. 5: X ray diffraction pattern of Comparative compound 3 produced in Comparative Example 3

The precipitate thus obtained was immediately filtered and washed with deionized water at 10° C. until the conductivity of the filtrate became no greater than 50 µS/cm. Filtration and washing were completed in 30 minutes. This precipitate was dried at 120° C. for 24 hours. Subsequently, it was ground to give Comparative compound 3. When this compound was analyzed, it was found to be a $Bi_2O_3$ mixture, and the $NO_3$ content was 0.2%. Comparative compound 3 was subjected to powder X ray diffraction (XRD) measurement. This diffraction pattern is shown in FIG. 5. The powder X ray diffraction pattern of Comparative compound 3 was substantially amorphous, but since there were small diffraction peaks of less than 10,000 cps at a peak position different from those of $\alpha$-$Bi_2O_3$ it was concluded that crystals of an unknown phase were formed. As in Example 1, Comparative compound 3 was subjected to measurement of primary particle size, secondary particle size, maximum particle size, specific surface area, ion exchange capacity, ion exchange rate, supernatant conductivity, etc., and these results are shown in Table 2.

Comparative Example 4

530 g of a 10% aqueous solution of sodium hydroxide was maintained at 25° C. Furthermore, 60 g of a 50% aqueous solution of bismuth nitrate was diluted with 200 g of 5% nitric acid, and 2.8 g of tartaric acid was further added, dissolved, and maintained at 25° C. The aqueous solution of sodium hydroxide prepared was charged into a 1 L beaker and stirred at 400 rpm while maintaining it at 25° C. The entire amount of the aqueous bismuth solution was added thereto at a speed of 20 mL/min using a roller pump, and a precipitate started to form at a pH of around 1.0. The pH of the slurry after the dropwise addition was 13.2. The precipitate thus obtained was immediately filtered and washed with deionized water at 10° C. until the conductivity of the filtrate became no greater than 50 µS/cm. Filtration and washing were completed in 30 minutes.

Figure 6:
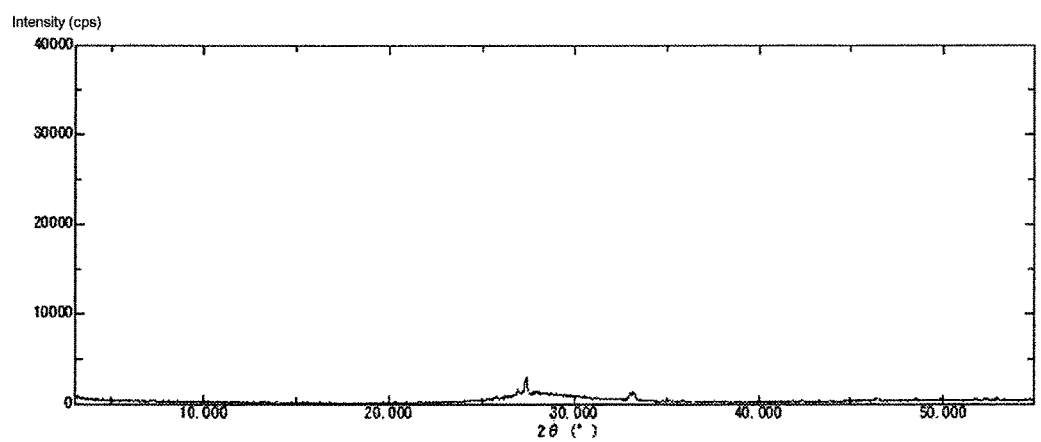
FIG. 6: X ray diffraction pattern of Comparative compound 4 produced in Comparative Example 4

This precipitate was dried at 120° C. for 24 hours. Subsequently, it was ground to give Comparative compound 4. When this compound was analyzed, the $NO_3$ content was 0.2%. Comparative compound 4 was subjected to powder X ray diffraction (XRD) measurement. This diffraction pattern is shown in FIG. 6. The powder X ray diffraction pattern of Comparative compound 4 showed diffraction peaks at peak positions of $\alpha$-$Bi_2O_3$ crystals, although it was a small peak of less than 10,000 cps. As in Example 1, Comparative compound 4 was subjected to measurement of primary particle size, secondary particle size, maximum particle size, specific surface area, ion exchange capacity, ion exchange rate, supernatant conductivity, etc., and these results are shown in Table 2.

Comparative Example 5

Figure 7:
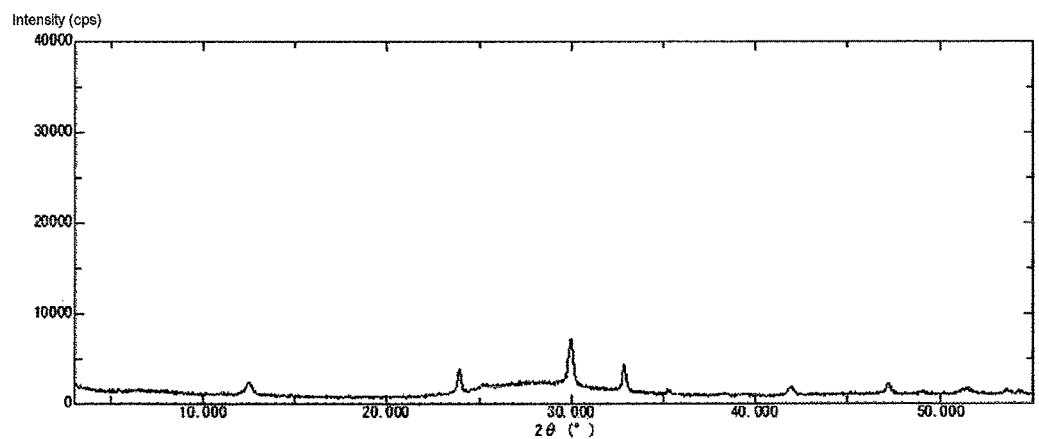
FIG. 7: X ray diffraction pattern of Comparative compound 5 produced in Comparative Example 5

180 g of a 50% aqueous solution of bismuth nitrate was diluted with 420 g of 5% nitric acid, and 2.8 g of tartaric acid was further added thereto, dissolved, and maintained at 25° C. While stirring at 25° C., 530 g of 10% sodium hydroxide was added using a funnel within 1 minute for the entire amount. The pH of the slurry after the dropwise addition was 13.2. The precipitate thus obtained was immediately filtered and washed with deionized water at 10° C. until the conductivity of the filtrate became no greater than 50 µS/cm. Filtration and washing were completed in 30 minutes. This precipitate was dried at 120° C. for 24 hours. Subsequently, it was ground to give Comparative compound 5. When this compound was analyzed, the $NO_3$ content was 0.2%. Comparative compound 5 was subjected to powder X ray diffraction (XRD) measurement. This diffraction pattern is shown in FIG. 7. The powder X ray diffraction pattern of Comparative compound 5 showed diffraction peaks at peak positions different from those of $\alpha$-$Bi_2O_3$ crystals, although they were small peaks of less than 10,000 cps, and crystals of an unknown phase were formed. As in Example 1, Comparative compound 5 was subjected to measurement of primary particle size, secondary particle size, maximum particle size, specific surface area, ion exchange capacity, ion exchange rate, supernatant conductivity, etc., and these results are shown in Table 2.

Comparative Example 6

Figure 8:
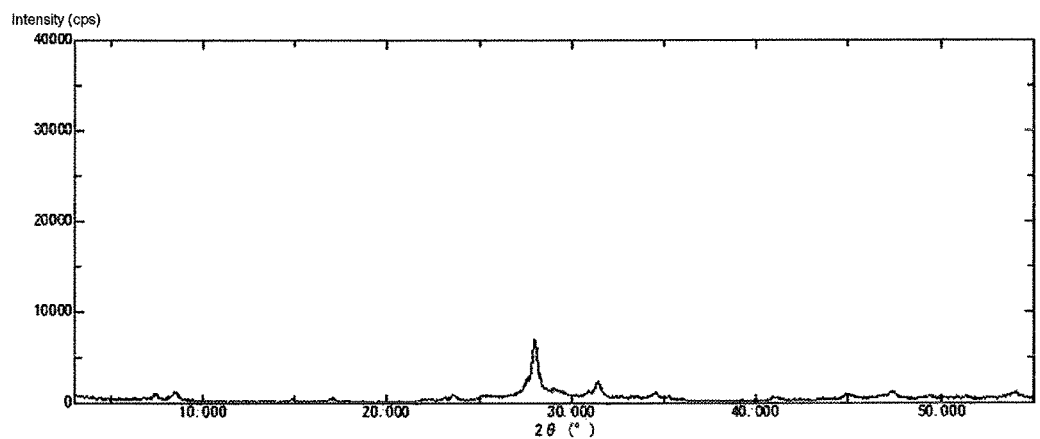
FIG. 8: X ray diffraction pattern of Comparative compound 6 produced in Comparative Example 6

A 50% aqueous solution of bismuth nitrate was maintained at 25° C. and, while stirring, a 15% aqueous solution of sodium hydroxide was added dropwise over 30 minutes to thus increase the pH to 8. In this process, a precipitate started to form at a pH of around 1. Subsequently, a 2% aqueous solution of sodium hydroxide was added dropwise thereto over 30 minutes, thus adjusting the pH of the solution to 10. The precipitate thus obtained was filtered and washed with deionized water. Filtration and washing were completed in 30 minutes. This precipitate was dried at 120° C. for 24 hours. Subsequently, it was ground to give Comparative compound 6. When this compound was analyzed, it was found to be $Bi(OH)_{2.65}(NO_3)_{0.35}$. Furthermore, this compound was subjected to powder X ray diffraction (XRD) measurement, and this diffraction pattern is shown in FIG. 8. From the results, it was found that the intensity of a peak at $2\theta=28°$ was 1,100 cps, the intensity of a peak at $2\theta=8.5°$ was 380 cps, and the intensity of a peak at 2θ=7.4° was 400 cps. That is, crystals of an unknown phase, which were different from α-Bi$_2$O$_3$, were formed.

As in Example 1, Comparative compound 6 was subjected to measurement of primary particle size, secondary particle size, maximum particle size, specific surface area, ion exchange capacity, ion exchange rate, supernatant conductivity, etc., and these results are shown in Table 2.

Comparative Example 7

Figure 9:
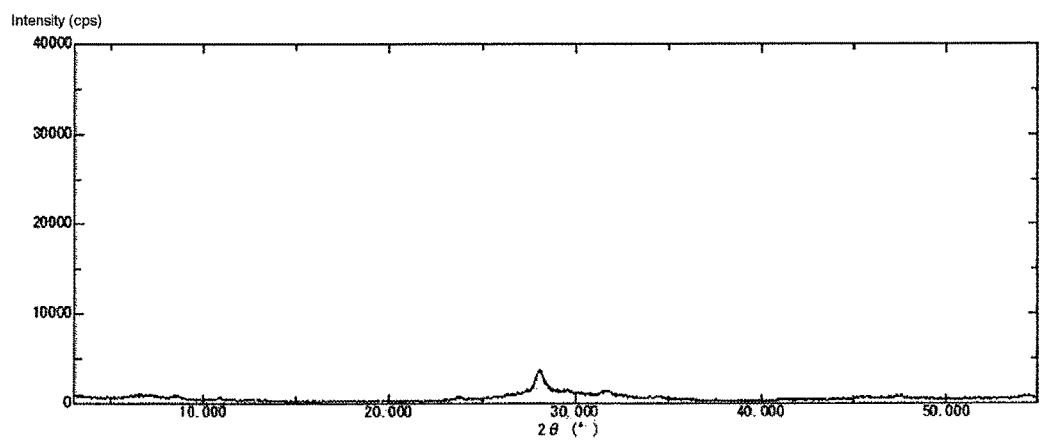
FIG. 9: X ray diffraction pattern of Comparative compound 7 produced in Comparative Example 7

Reagent grade bismuth hydroxide Bi(OH)$_3$ was used as Comparative compound 7. The XRD diffraction pattern is shown in FIG. 9. In the XRD diffraction of this bismuth hydroxide, the intensity of a peak at 2θ=28° C. was 2,800 cps, the intensity of a peak at 2θ=8.5° was 900 cps, and no peak was detected at 2θ=7.4°. That is, crystals of an unknown phase, which were different from α-Bi$_2$O$_3$, were formed.

As in Example 1, Comparative compound 7 was subjected to measurement of primary particle size, secondary particle size, maximum particle size, specific surface area, ion exchange capacity, ion exchange rate, supernatant conductivity, etc., and these results are shown in Table 2.

Comparative Example 8

Figure 10:
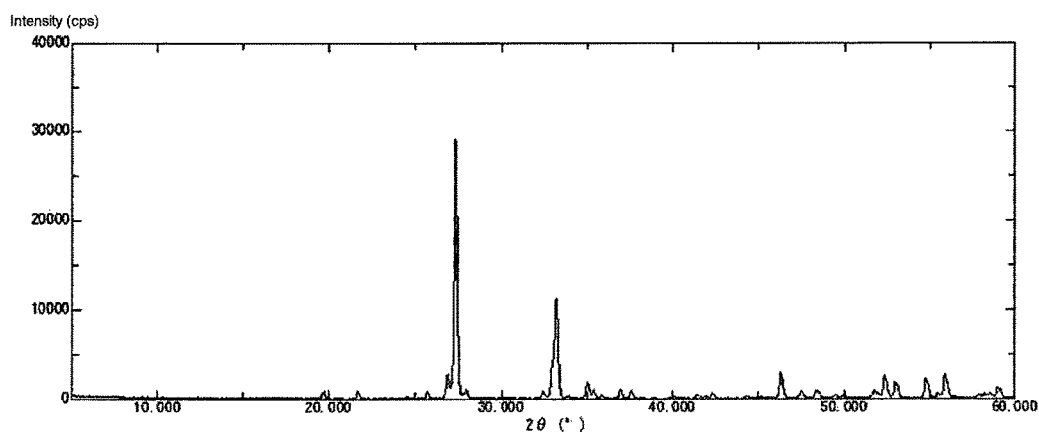
FIG. 10: X ray diffraction pattern of Comparative compound 8 produced in Comparative Example 8

Reagent grade bismuth oxide Bi$_2$O$_3$ was used as Comparative compound 8. The XRD diffraction pattern is shown in FIG. 10.

As in Example 1, Comparative compound 8 was subjected to measurement of primary particle size, secondary particle size, maximum particle size, specific surface area, ion exchange capacity, ion exchange rate, supernatant conductivity, etc., and these results are shown in Table 2.

Since all of the bismuth compounds obtained in Comparative Examples 1 to 8 were crystalline and had a large maximum particle size, they were not suitable for use in an application such as a sealing agent for a semiconductor having a fine structural shape. On the other hand, all of the amorphous inorganic anion exchangers of the Examples were excellent in terms of high ion exchange rate compared with those obtained in Comparative Examples 1 to 5 or Comparative Example 8, which had the same level of NO$_3$ content. Since those obtained in Comparative Examples 6 and 7 had a high ion exchange rate but a markedly high NO$_3$ content, there was concern for leaching out of NO$_3$ ions, and they were not suitable for an application such as a sealing agent for a semiconductor. Although the amorphous inorganic anion exchanger of the present invention had a low NO$_3$ content of no greater than 1%, it exhibited a high ion exchange rate. It can be said that, in accordance with the process for producing an amorphous bismuth compound of the present invention, an amorphous bismuth compound having a low NO$_3$ content of no greater than 1% but a high ion exchange rate and a small maximum particle size can be obtained, and such an amorphous bismuth compound is preferably used in an application such as a sealing agent for a semiconductor having a fine structural shape.

Example 8

Aluminum Wiring Corrosion Test
<Preparation of Sample>

72 parts of a bisphenol epoxy resin (epoxy equivalent 190), 28 parts of an amine-based curing agent (Kayahard AA manufactured by Nippon Kayaku Co., Ltd.: molecular weight 252), 100 parts of fused silica, 1 part of an epoxy-based silane coupling agent, and 0.2 parts of amorphous inorganic anion exchanger 1 were mixed well using a spatula, and further mixed using a three roll mill. Furthermore, this mixture was placed in a vacuum dryer and degassed under vacuum at 35° C. for 1 hour.

TABLE 1

| | XRD measurement result | Primary particle size (nm) | NO$_3$ content (%) | Specific surface area (m$^2$/g) | Secondary particle size (nm) | Maximum particle size (μm) | Ion exchange capacity (meq/g) | Ion exchange rate (meq/g) | Supernatant conductivity (μS/cm) |
|---|---|---|---|---|---|---|---|---|---|
| Example 1 | Amorphous | 120 | 0.6 | 14.0 | 210 | 0.7 | 3.8 | 3.8 | 7.1 |
| Example 2 | Amorphous | 50 | 0.2 | 29.0 | 230 | 0.6 | 3.7 | 3.7 | 7.8 |
| Example 3 | Amorphous | 70 | 0.2 | 28.0 | 250 | 0.6 | 3.6 | 3.6 | 8.0 |
| Example 4 | Amorphous | 90 | 0.2 | 27.0 | 230 | 0.6 | 3.5 | 3.5 | 8.1 |
| Example 5 | Amorphous | 110 | 0.2 | 25.0 | 260 | 0.7 | 3.5 | 3.5 | 8.0 |
| Example 6 | Amorphous | 100 | 0.2 | 26.0 | 250 | 0.7 | 3.6 | 3.5 | 11.0 |
| Example 7 | Amorphous | 50 | 0.7 | 45.0 | 220 | 0.6 | 3.7 | 3.7 | 48.0 |

TABLE 2

| | XRD measurement result | Primary particle size (nm) | NO$_3$ content (%) | Specific surface area (m$^2$/g) | Secondary particle size (nm) | Maximum particle size (μm) | Ion exchange capacity (meq/g) | Ion exchange rate (meq/g) | Supernatant conductivity (μS/cm) |
|---|---|---|---|---|---|---|---|---|---|
| Comp. Ex. 1 | α-Bi$_2$O$_3$ | 12,000 | 0.6 | 4.0 | 17,000 | 45 | 3.9 | 2.2 | 6.0 |
| Comp. Ex. 2 | α-Bi$_2$O$_3$ | 11,000 | 0.4 | 1.5 | 7,600 | 52 | 4.1 | 2.0 | 5.5 |
| Comp. Ex. 3 | Crystalline | 2,200 | 0.2 | 5.7 | 3,000 | 23 | 3.6 | 2.5 | 7.5 |
| Comp. Ex. 4 | α-Bi$_2$O$_3$ | 3,000 | 0.2 | 10.3 | 4,000 | 23 | 3.6 | 3.2 | 7.9 |
| Comp. Ex. 5 | Crystalline | 2,100 | 0.2 | 5.8 | 4,000 | 26 | 3.6 | 2.7 | 7.4 |
| Comp. Ex. 6 | Crystalline | 10,000 | 6.2 | 6.8 | 8,700 | 79 | 4.0 | 3.9 | 2.0 |
| Comp. Ex. 7 | Crystalline | 7,800 | 8.5 | 6.6 | 7,800 | 91 | 4.0 | 3.8 | 8.4 |
| Comp. Ex. 8 | α-Bi$_2$O$_3$ | 6,900 | 0.2 | 1.3 | 6,900 | 52 | 4.1 | 1.9 | 5.2 |

The resin composition (resin composition for electronic component sealing) thus mixed was applied at a thickness of 1 mm to a glass plate having printed thereon double aluminum wiring (wire width 20 μm, film thickness 0.15 μm, length 1,000 mm, wire distance 20 μm, resistance about 9 kΩ) and cured at 120° C. (aluminum wiring sample 1).
<Corrosion Test>

Aluminum wiring sample 1 thus produced was subjected to a pressure cooker test (PCT test) (instrument used: PLAMOUNT-PM220 manufactured by Kusumoto Chemicals, Ltd., 130° C.±2° C., 85% RH (±5%), applied voltage 40V, time 40 hours). The resistance of the aluminum wiring at the positive electrode was measured before and after the PCT test, and the percentage change in resistance was evaluated as (resistance after PCT test/resistance before PCT test)×100(%). Moreover, the degree of corrosion of the aluminum wiring was examined from the reverse face using a microscope. The results are shown in Table 3.

Example 9

A corrosion test was carried out by producing aluminum wiring sample 2 by the same procedure as in Example 8 except that amorphous inorganic anion exchanger 2 was used instead of amorphous inorganic anion exchanger 1. The results are shown in Table 3.

Example 10

A corrosion test was carried out by producing aluminum wiring sample 3 by the same procedure as in Example 8 except that amorphous inorganic anion exchanger 3 was used instead of amorphous inorganic anion exchanger 1. The results are shown in Table 3.

Example 11

A corrosion test was carried out by producing aluminum wiring sample 4 by the same procedure as in Example 8 except that amorphous inorganic anion exchanger 4 was used instead of amorphous inorganic anion exchanger 1. The results are shown in Table 3.

Example 12

A corrosion test was carried out by producing aluminum wiring sample 5 by the same procedure as in Example 8 except that amorphous inorganic anion exchanger 5 was used instead of amorphous inorganic anion exchanger 1. The results are shown in Table 3.

Example 13

A corrosion test was carried out by producing aluminum wiring sample 6 by the same procedure as in Example 8 except that amorphous inorganic anion exchanger 6 was used instead of amorphous inorganic anion exchanger 1. The results are shown in Table 3.

Example 14

A corrosion test was carried out by producing aluminum wiring sample 7 by the same procedure as in Example 8 except that amorphous inorganic anion exchanger 7 was used instead of amorphous inorganic anion exchanger 1. The results are shown in Table 3.

Example 15

Amorphous inorganic anion exchanger 1 and α-zirconium phosphate (volume-based median diameter by laser particle size distribution analyzer 1 μm) were uniformly mixed at a ratio by weight of 7:3, thus giving inorganic anion exchanger 8. A corrosion test was carried out by producing aluminum wiring sample 8 by the same procedure as in Example 8 except that the above was used. The results are shown in Table 3.

Example 16

Amorphous inorganic anion exchanger 2 and α-zirconium phosphate (volume-based median diameter by laser particle size distribution analyzer 1 μm) were uniformly mixed at a ratio by weight of 7:3, thus giving inorganic anion exchanger 9. A corrosion test was carried out by producing aluminum wiring sample 9 by the same procedure as in Example 8 except that the above was used. The results are shown in Table 3.

Example 17

Amorphous inorganic anion exchanger 3 and α-zirconium phosphate (volume-based median diameter by laser particle size distribution analyzer 1 μm) were uniformly mixed at a ratio by weight of 7:3 as a ratio by mass, thus giving inorganic anion exchanger 10. A corrosion test was carried out by producing aluminum wiring sample 10 by the same procedure as in Example 8 except that the above was used. The results are shown in Table 3.

Example 18

Amorphous inorganic anion exchanger 4 and α-zirconium phosphate (volume-based median diameter by laser particle size distribution analyzer 1 μm) were uniformly mixed at a ratio by weight of 7:3, thus giving inorganic anion exchanger 11. A corrosion test was carried out by producing aluminum wiring sample 11 by the same procedure as in Example 8 except that the above was used. The results are shown in Table 3.

Example 19

Inorganic anion exchanger 5 and α-zirconium phosphate (volume-based median diameter by laser particle size distribution analyzer 1 μm) were uniformly mixed at a ratio by weight of 7:3, thus giving inorganic anion exchanger 12. A corrosion test was carried out by producing aluminum wiring sample 12 by the same procedure as in Example 8 except that the above was used. The results are shown in Table 3.

Example 20

Inorganic anion exchanger 6 and α-zirconium phosphate (particle size 1 μm) were uniformly mixed at a ratio by weight of 7:3, thus giving inorganic anion exchanger 13. A corrosion test was carried out by producing aluminum wiring sample 13 by the same procedure as in Example 8 except that the above was used. The results are shown in Table 3.

Example 21

Inorganic anion exchanger 7 and α-zirconium phosphate (particle size 1 μm) were uniformly mixed at a ratio by weight of 7:3, thus giving inorganic anion exchanger 14. A corrosion test was carried out by producing aluminum wiring sample 14 by the same procedure as in Example 8 except that the above was used. The results are shown in Table 3.

Comparative Reference Example

A corrosion test was carried out by producing a comparative reference aluminum wiring sample by the same procedure as in Example 8 except that inorganic anion exchanger 1 was not used. The results are shown in Table 3.

Comparative Example 9

A corrosion test was carried out by producing comparative aluminum wiring sample 1 by the same procedure as in Example 8 except that Comparative compound 1 was used instead of amorphous inorganic anion exchanger 1. The results are shown in Table 3.

Comparative Example 10

A corrosion test was carried out by producing comparative aluminum wiring sample 2 by the same procedure as in Example 8 except that Comparative compound 2 was used instead of amorphous inorganic anion exchanger 1. The results are shown in Table 3.

Comparative Example 11

A corrosion test was carried out by producing comparative aluminum wiring sample 3 by the same procedure as in Example 8 except that Comparative compound 3 was used instead of amorphous inorganic anion exchanger 1. The results are shown in Table 3.

Comparative Example 12

A corrosion test was carried out by producing comparative aluminum wiring sample 4 by the same procedure as in Example 8 except that Comparative compound 4 was used instead of amorphous inorganic anion exchanger 1. The results are shown in Table 3.

Comparative Example 13

A corrosion test was carried out by producing comparative aluminum wiring sample 5 by the same procedure as in Example 8 except that Comparative compound 5 was used instead of amorphous inorganic anion exchanger 1. The results are shown in Table 3.

Comparative Example 14

A corrosion test was carried out by producing comparative aluminum wiring sample 6 by the same procedure as in Example 8 except that Comparative compound 6 was used instead of amorphous inorganic anion exchanger 1. The results are shown in Table 3.

Comparative Example 15

A corrosion test was carried out by producing comparative aluminum wiring sample 7 by the same procedure as in Example 8 except that Comparative compound 7 was used instead of amorphous inorganic anion exchanger 1. The results are shown in Table 3.

Comparative Example 16

A corrosion test was carried out by producing comparative aluminum wiring sample 8 by the same procedure as in Example 8 except that Comparative compound 8 was used instead of amorphous inorganic anion exchanger 1. The results are shown in Table 3.

TABLE 3

|  | Percentage change in positive electrode resistance (%) | State of corrosion of aluminum wiring (microscope observation) |
|---|---|---|
| Aluminum wiring sample 1 | 2.2 | Slight corrosion |
| Aluminum wiring sample 2 | 2.0 | Slight corrosion |
| Aluminum wiring sample 3 | 2.1 | Slight corrosion |
| Aluminum wiring sample 4 | 2.1 | Slight corrosion |
| Aluminum wiring sample 5 | 2.1 | Slight corrosion |
| Aluminum wiring sample 6 | 2.2 | Slight corrosion |
| Aluminum wiring sample 7 | 2.8 | Slight corrosion |
| Aluminum wiring sample 8 | 1.2 | Corrosion not confirmed |
| Aluminum wiring sample 9 | 1.1 | Corrosion not confirmed |
| Aluminum wiring sample 10 | 1.3 | Corrosion not confirmed |
| Aluminum wiring sample 11 | 1.3 | Corrosion not confirmed |
| Aluminum wiring sample 12 | 1.2 | Corrosion not confirmed |
| Aluminum wiring sample 13 | 1.3 | Corrosion not confirmed |
| Aluminum wiring sample 14 | 1.9 | Slight corrosion |
| Comparative reference aluminum wiring sample | ∞ | Open circuit due to corrosion |
| Comparative aluminum wiring sample 1 | 11 | Severe corrosion |
| Comparative aluminum wiring sample 2 | 10 | Severe corrosion |
| Comparative aluminum wiring sample 3 | 7.8 | Much corrosion |
| Comparative aluminum wiring sample 4 | 6.6 | Much corrosion |
| Comparative aluminum wiring sample 5 | 7.6 | Much corrosion |
| Comparative aluminum wiring sample 6 | 10 | Severe corrosion |
| Comparative aluminum wiring sample 7 | 11 | Severe corrosion |
| Comparative aluminum wiring sample 8 | 10 | Severe corrosion |

As is clear from Table 3, the amorphous inorganic anion exchanger of the present invention has a high effect in suppressing corrosion of aluminum wiring when used in the resin composition for electronic component sealing. This makes it possible to provide a resin composition for electronic component sealing that enhances the reliability of electronic components over a wide range.

INDUSTRIAL APPLICABILITY

The amorphous inorganic anion exchanger of the present invention and the amorphous bismuth compound obtained by the process for producing an amorphous bismuth compound of the present invention have excellent anion exchangeability. When the amorphous inorganic anion exchanger of the present invention or the amorphous bismuth compound obtained by the process for producing an amorphous bismuth compound of the present invention is added to a resin, an effect in suppressing leaching out of anions from the resin is exhibited. From this, the amorphous inorganic anion exchanger of the present invention and the amorphous bismuth compound obtained by the process for producing an amorphous bismuth compound of the present invention can be used in various applications over a wide range such as sealing, covering, and insulation of electronic components or electrical components with high reliability. Furthermore, the amorphous inorganic anion exchanger of the present invention and the amorphous bismuth compound obtained by the process for producing an amorphous bismuth compound of the present invention can be used in stabilizers or corrosion inhibitors for resins such as vinyl chloride.

What is claimed is:

1. An amorphous inorganic anion exchanger, represented by Formula (1), having:
    an average primary particle size observed with an electron microscope of at least 1 nm but no greater than 500 nm,
    a $NO_3^-$ content of no greater than 1 wt % of a whole,
    a specific surface area by a BET method of 10 to 100 $m^2/g$,
    a median diameter on a volume basis measured by a laser diffraction type particle size distribution analyzer within a range of from 0.01 μm to 20 μm, and
    a maximum particle size measured by a laser diffraction type particle size distribution analyzer no greater than 20 μm, BiO(OH)    Formula (1).

2. The amorphous inorganic anion exchanger according to claim 1, wherein the anion exchange capacity at 25° C. is at least 2.0 meq/g.

3. The amorphous inorganic anion exchanger according to claim 1, wherein the anion exchange rate at 25° C. for 10 minutes is at least 2.5 meq/g.

4. The amorphous inorganic anion exchanger according to claim 1, wherein a suspension thereof in deionized water has a supernatant conductivity of no greater than 50 μS/cm.

5. A resin composition for electronic component sealing, comprising the amorphous inorganic anion exchanger according to claim 1.

6. The resin composition for electronic component sealing according to claim 5, wherein the resin composition further comprises an inorganic cation exchanger.

7. A resin for electronic component sealing that is formed by curing the resin composition for electronic component sealing according to claim 5.

8. An electronic component that is formed by sealing a device with the resin composition for electronic component sealing according to claim 5.

9. A varnish comprising the amorphous inorganic anion exchanger according to claim 1.

10. The varnish according to claim 9, wherein the vanish further comprises an inorganic cation exchanger.

11. An article comprising the varnish according to claim 9.

12. An adhesive comprising the amorphous inorganic anion exchanger according to claim 1.

13. The adhesive according to claim 12, wherein the adhesive further comprises an inorganic cation exchanger.

14. An article that is adhered by means of the adhesive according to claim 12.

15. A paste comprising the amorphous inorganic anion exchanger according to claim 1.

16. The paste according to claim 15, wherein the paste further comprises an inorganic cation exchanger.

17. An article comprising the paste according to claim 15.

* * * * *